(12) United States Patent
Ishimaru et al.

(10) Patent No.: US 8,178,472 B2
(45) Date of Patent: May 15, 2012

(54) SUPERCONDUCTING DEVICE AND METHOD OF MANUFACTURING THE SAME

(75) Inventors: Yoshihiro Ishimaru, Kanagawa (JP); Yoshinobu Tarutani, Tokyo (JP); Keiichi Tanabe, Chiba (JP)

(73) Assignees: Fujitsu Limited, Kawasaki (JP); International Superconductivity Technology Center, The Juridical Foundation, Tokyo (JP)

( * ) Notice: Subject to any disclaimer, the term of this patent is extended or adjusted under 35 U.S.C. 154(b) by 672 days.

(21) Appl. No.: 11/806,175

(22) Filed: May 30, 2007

(65) Prior Publication Data

US 2007/0281861 A1 Dec. 6, 2007

(30) Foreign Application Priority Data

May 30, 2006 (JP) .................. 2006-149652

(51) Int. Cl.
*H01L 39/22* (2006.01)
(52) U.S. Cl. ........ 505/329; 505/190; 505/861; 505/864; 505/865; 505/874
(58) Field of Classification Search .................. 505/190, 505/329, 861, 864, 865, 874
See application file for complete search history.

(56) References Cited

U.S. PATENT DOCUMENTS

| | | | | |
|---|---|---|---|---|
| 5,757,243 A | * | 5/1998 | Mizuno et al. ............. | 331/107 S |
| 5,831,278 A | * | 11/1998 | Berkowitz ..................... | 257/31 |
| 5,945,383 A | * | 8/1999 | Hunt ............................. | 505/329 |
| 6,476,413 B1 | | 11/2002 | Jia et al. ..................... | 257/33 |
| 6,541,789 B1 | | 4/2003 | Sato et al. | |
| 2005/0092981 A1 | | 5/2005 | Hunt ............................. | 257/31 |

FOREIGN PATENT DOCUMENTS

| | | |
|---|---|---|
| EP | 0 567 386 A2 | 10/1993 |
| JP | 8-330641 | 12/1996 |
| JP | 9-260734 | 10/1997 |
| JP | 2000-150974 | 5/2000 |
| JP | 2006-66783 | 3/2006 |

OTHER PUBLICATIONS

Koelle D et al: "DC Squid Magnetometers From Single Layers of YBA2CU307-X" Applied Physics Letters, AIP, American Institute of Physics, Melville, NY, US, vol. 63,No. 16, Oct. 18, 1993, pp. 2271-2273, XP000404444 ISSN: 0003-6951 * p. 2271, left-hand column, line 31-right-hand column, line 25; figures 1, 2*.

Extended European Search Report dated May 8, 2009.

* cited by examiner

*Primary Examiner* — Paul Wartalowicz
(74) *Attorney, Agent, or Firm* — Krats, Quintos & Hanson, LLP

(57) ABSTRACT

The present invention provides a superconducting device including a substrate, a first superconducting pattern formed on the substrate, an insulating pattern formed on the first superconducting pattern, and a second superconducting pattern formed at the uppermost level in the multilayered superconducting pattern. A barrier layer of a Josephson junction is formed on the lower side of, or within the second superconducting pattern. The second superconducting pattern constitutes a circuit element on the insulating pattern.

8 Claims, 33 Drawing Sheets

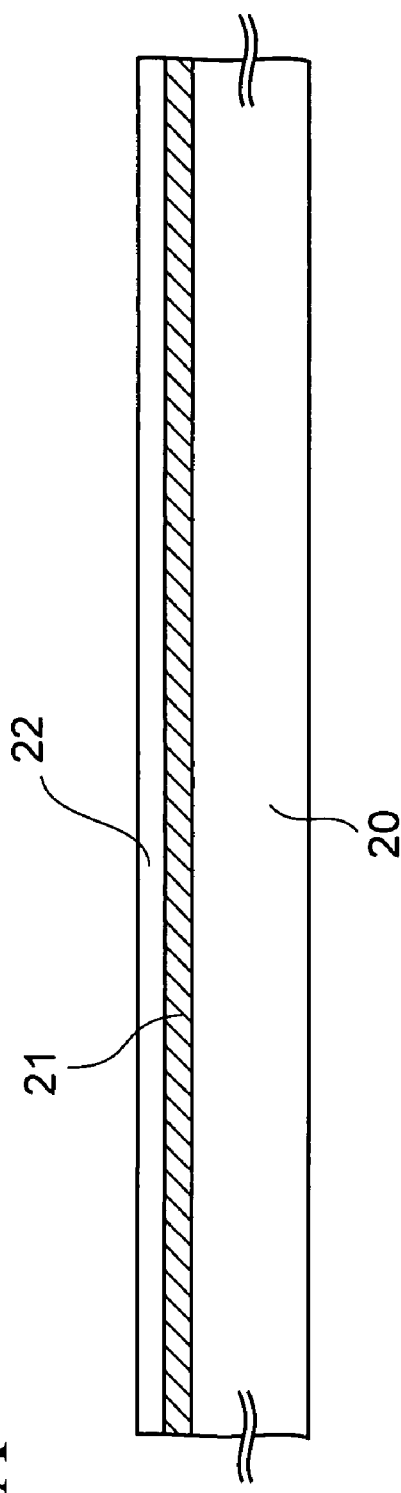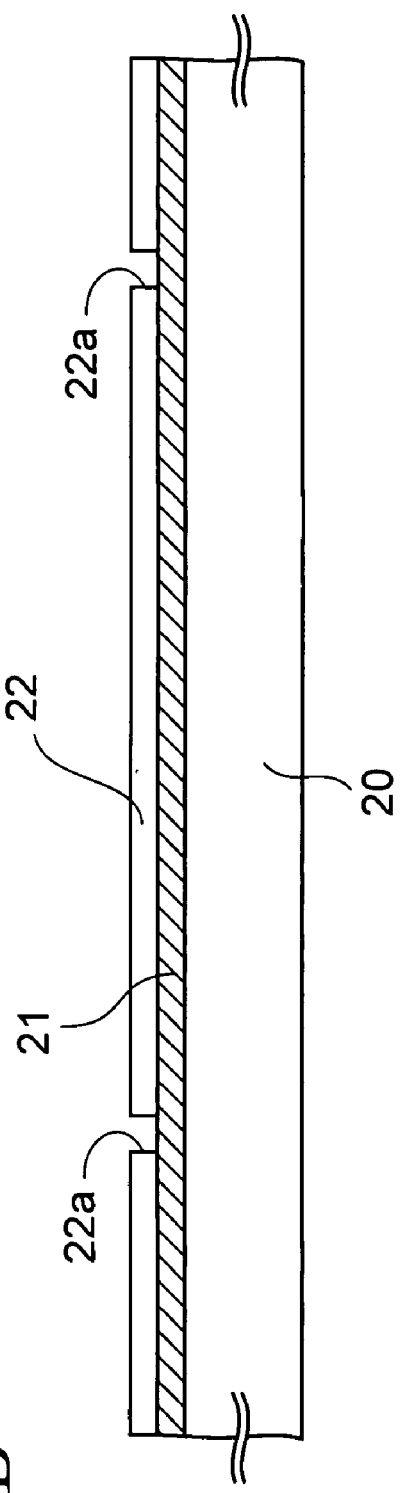

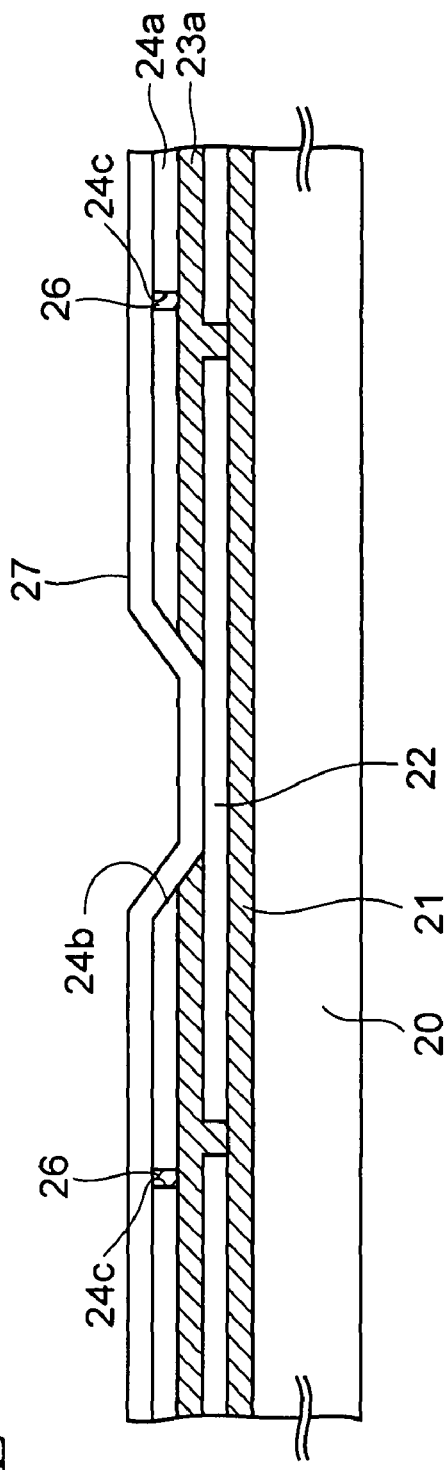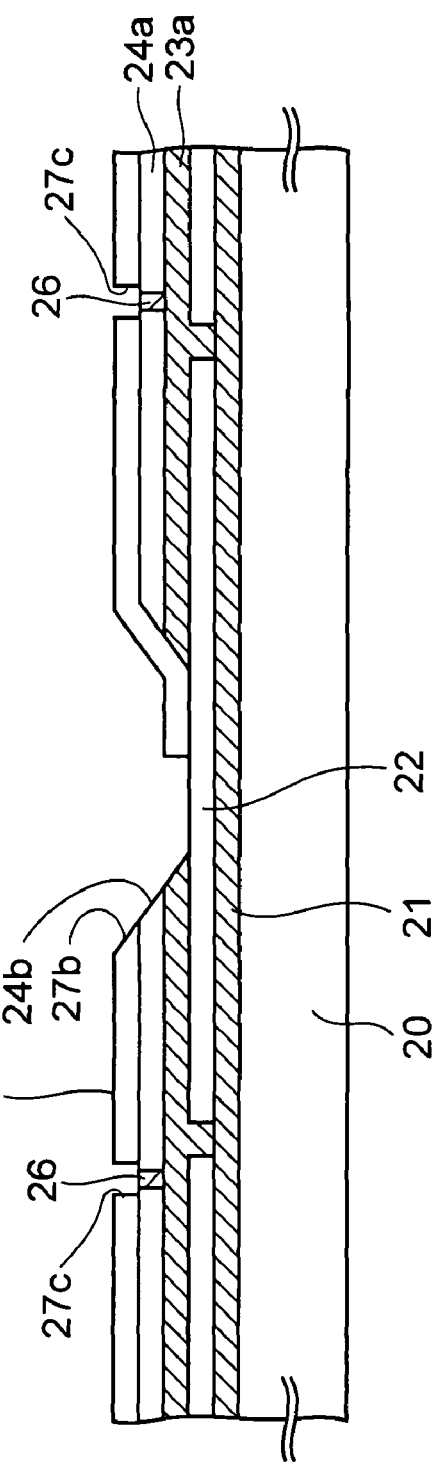
FIG. 17E
FIG. 17F

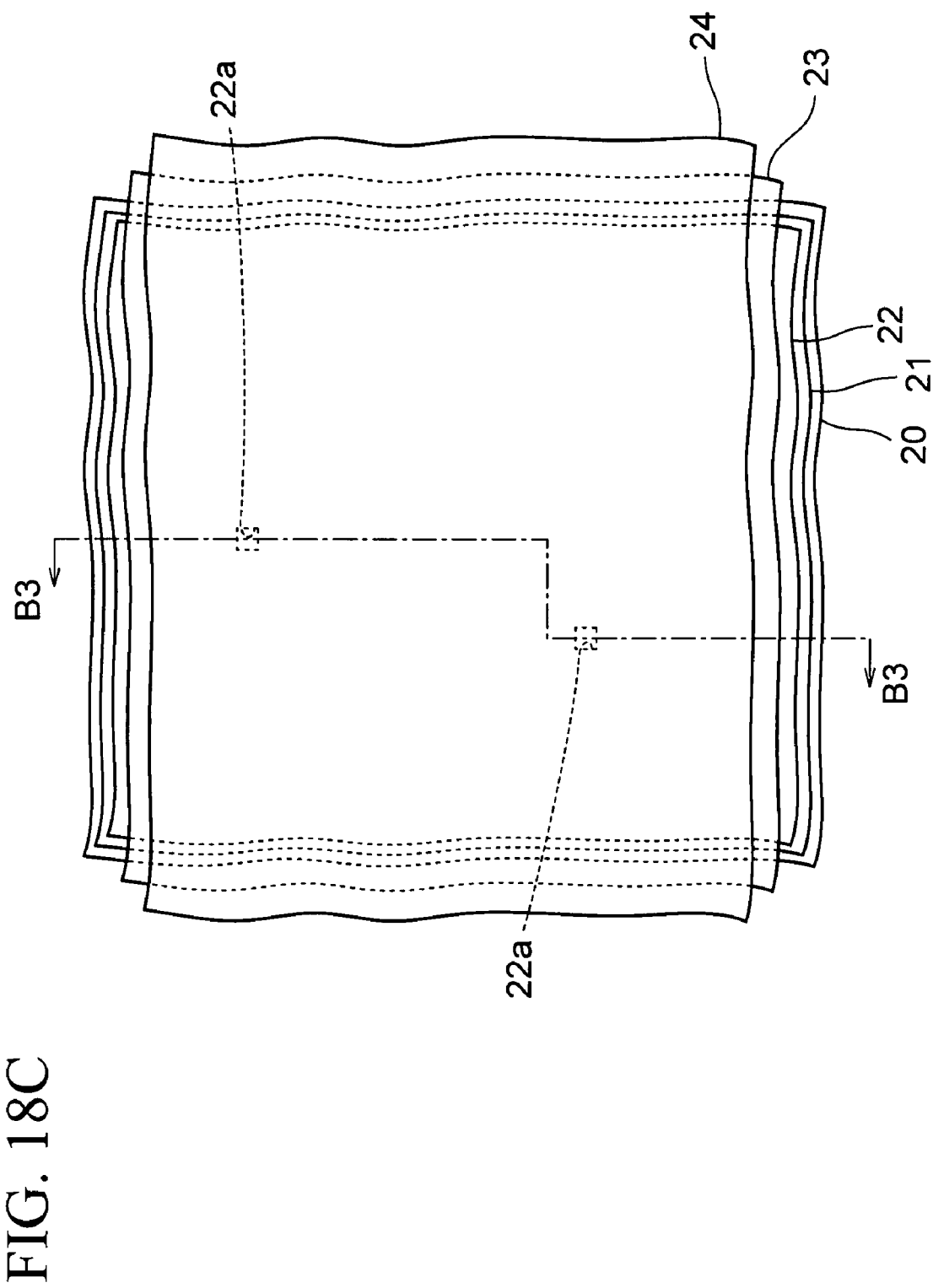

SUPERCONDUCTING DEVICE AND METHOD OF MANUFACTURING THE SAME

CROSS-REFERENCE TO RELATED APPLICATIONS

This application is based on and claims priority of Japanese Patent Application No. 2006-149652 filed on May 30, 2006, the entire contents of which are incorporated herein by reference.

BACKGROUND OF THE INVENTION

1. Field of the Invention

The present invention relates to a superconducting device and a method of manufacturing the same.

2. Description of the Related Art

A superconducting device with a Josephson junction is a device expected to be practically applied to an SFQ (Single Flux Quantum) circuit using a single flux quantum as an information medium, a SQUID (Superconducting Quantum Interference Device) that is a highly-sensitive magnetic field sensor, or the like (See JP-A Nos. Hei 8-330641 and Hei 9-260734.).

Many methods of manufacturing the superconducting device with the Josephson junction have been proposed. (See JP-A Nos. Hei 8-330641, Hei 9-260734, 2000-150974 and 2006-66783.) The Josephson junctions are classified into several types according to their forming methods.

When a superconducting thin film is superposed on a bicrystal substrate formed of two single crystal substrates bonded together with their crystallographic orientation obliquely aligned, a grain boundary is formed in the thin film along a junction line (a bicrystal line) between the two substrates. The grain boundary forms a barrier layer of a Josephson junction, and thereby the Josephson junction is formed on the substrate.

When an oxide superconducting thin film is superposed on a surface of a bicrystal substrate, a grain boundary is formed in the thin film along the bicrystal line. This grain boundary forms a barrier layer of a Josephson junction, and thereby the Josephson junction (a step-edge Josephson junction) is formed on the substrate.

Besides the Josephson junction formed by using the bicrystal substrate or the step edge to form the grain boundary as the barrier layer of the Josephson junction, the Josephson junctions include a ramp-edge type Josephson junction fabricated by forming a ramp edge on a superconducting thin film, amorphizing the edge surface, forming a superconducting layer on the edge surface, and then recrystallizing the amorphous edge surface to form a barrier layer, as described in JP-A Nos. 2000-150974 and 2006-66783.

However, the superconducting devices disclosed in JP-A Nos. Hei 8-330641, Hei 9-260734, 2000-150974 and 2006-66783 cannot be used to fabricate a larger-scale SFQ circuit or to fabricate a SQUID of higher sensitivity, because they include only one layer of a superconducting circuit pattern formed on the substrate.

Fabrication of a larger-scale SFQ or SQUID circuit requires a superconducting device of a multilayer structure in which a plurality of superconducting circuit patterns are superposed on one another. However, good characteristics cannot be obtained even if the multilayer structure is fabricated by depositing an insulating thin film and another oxide superconducting thin film on the Josephson junction formed on the bicrystal substrate. Descriptions will be given of the reasons for this with reference to the conventional technologies.

FIGS. 1A and 1B illustrate a conventional fabrication method. FIGS. 1A and 1B show a cross-sectional view and a plan view, respectively. A superconducting thin film 3a, which is formed by forming a single-layer superconducting thin film, and then by forming a circuit pattern thereon, is superposed on an insulating bicrystal substrate 1. Thereby, a superconducting thin film grain boundary 33 is formed on a bicrystal line 2. The grain boundary 33 forms a barrier layer of a Josephson junction, and thus a SQUID or another circuit can be fabricated. In this case, only a circuit of a simple structure can be fabricated because only a single superconducting layer is formed.

To deal with this problem, some attempts have been made to fabricate the multilayer structure by depositing an insulating thin film and a second-level superconducting thin film.

FIGS. 2A and 2B illustrate a conventional method of fabricating a multilayer structure using a bicrystal substrate. FIGS. 2A and 2B show a cross-sectional view and a plan view, respectively, of the multilayer structure. A Josephson junction is formed in a first-level superconducting thin film 3a, as in the case of the structure shown in FIGS. 1A and 1B. When an insulating layer 5 and a second-level superconducting layer 8 are deposited on the first-level superconducting thin film 3a, elements that constitute an insulator and the like are diffused, during a substrate heating process essential for deposition, into the grain boundary on the bicrystal substrate which functions as the barrier layer of the Josephson junction. This leads to deterioration in junction characteristics of the previously-formed Josephson junction.

FIGS. 3A and 3B illustrate a conventional method of fabricating a multilayer structure using a step-edge substrate. FIGS. 3A and 3B show a cross-sectional view and a plan view, respectively, of a multilayer structure. A Josephson junction is formed in a first-level superconducting thin film 3a, as in the case of the structure shown in FIGS. 2A and 2B. When a insulating layer 5a and a second-level superconducting layer 8a are deposited on the first-level superconducting thin film 3a, elements that constitute an insulator or the like are diffused, during the substrate heating process essential for deposition, into the grain boundary 33 on the step edge 34 which functions as the barrier layer of the Josephson junction. This leads to deterioration in the junction characteristics of the previously-formed Josephson junction.

In these cases, a superconducting circuit of a complicated structure can be fabricated, but circuit characteristics are not good because the junction characteristics of the Josephson junction are thus deteriorated.

The junction characteristics of a ramp-edge junction of a surface-engineered type similarly change, when a Josephson junction is formed and then an insulating thin film and an oxide superconducting thin film are deposited on the Josephson junction. The reason is that this leads to a change in a crystal structure of the barrier of the Josephson junction during the heating process. A superconducting circuit that can be correctly operated cannot be fabricated, when the characteristics of the Josephson junction are changed, for example, when the critical current passing through the junction deviates from a designed value.

Next, detailed descriptions will be given of the conventional technologies using the ramp-edge junction of the surface-engineered type.

FIGS. 4A and 4B illustrate a cross section of a circuit using the ramp-edge junction of a surface-engineered type having the simplest structure. FIGS. 4A and 4B show a cross-sectional view and a plan view, respectively, of the multilayer structure. A first-level first superconducting layer 23 and a first insulating layer 24 are deposited on an insulating substrate 20, and then a circuit pattern is formed thereon. Thereby, an amorphous layer 23c, which is formed by the amorphous first superconducting layer 23, is formed on a ramp-edge 23b.

After a second-level second superconducting layer 31 is deposited, the amorphous layer is recrystallized due to the heating of the substrate for forming the second superconducting layer, and thereby changes into a barrier layer 23d for a ramp-edge junction. The barrier layer 23d for a ramp-edge junction forms the barrier layer of the Josephson junction, and thereby the Josephson junction can be formed. Then, various circuits can be fabricated.

In this case, the junction characteristics do not change because of the absence of the heating process after forming the junction. However, a pattern intersecting the inclined surface 23b of the first superconducting layer cannot be formed since the inclined surface 23b is exposed except for a portion thereof for forming the junction. This configuration prohibits installation of wiring or the like on the insulating layer 24. Accordingly, this method can be said as the one that significantly decreases the degree of freedom of forming circuit elements, wiring or the like.

FIGS. 5A and 5B illustrate a structure in which a ground plane 21 of an oxide superconducting thin film is disposed below a junction layer. FIGS. 5A and 5B show a cross-sectional view and a plan view, respectively, of a multilayer structure. In this case, as in the case of the structure shown in FIGS. 4A and 4B, a wiring layer or the like cannot be disposed above the junction layer, and thereby it is difficult to implement a complicated circuit, although the junction characteristics do not change because of the absence of the heating process after forming the junction.

FIG. 5C illustrates a structure in which the ground plane 21 of the oxide superconducting thin film is disposed above the junction layer. Also in this case, it is difficult to implement a complicated circuit because of the absence of the wiring layer or the like. Moreover, the ground plane 21, which is the oxide superconducting thin film, and a second insulating layer 27 are deposited above the junction after forming the junction. For this reason, the junction is adversely affected by the influence of the heating process, and the junction characteristics are deteriorated due to a subtle change in the crystal structure of the barrier.

FIGS. 6A and 6B illustrate a structure in which the ground plane 21 of an oxide superconducting thin film is disposed below a junction layer, and in which an upper wiring structure is formed above the junction layer by depositing a third-level third superconducting layer 32 and a second insulating layer 27. FIGS. 6A and 6B show a cross-sectional view and a plan view, respectively, of a multilayer structure. For this ramp-edge junction circuit, it is necessary to form an upper superconducting electrode using a part of an inclined surface 23b, and then to coat the rest of the inclined surface 23b with an insulating film, in order to form a circuit pattern within an island region where the inclined surface 23b is formed, and then to connect the pattern to the outside of the island region. In this case, a complicated circuit can be implemented since an upper wiring layer can be fabricated. However, the junction is adversely affected by the influence of the heating process since the third-level third superconducting layer 32 and the second insulating layer 27 are deposited on the junction after forming the junction. For this reason, the junction characteristics change due to the subtle change in the crystal structure of the barrier.

To fabricate a large-scale SFQ circuit or a complicated SQUID circuit, it is desirable that a device have a multilayer structure, and that a circuit element, such as wiring or a coil, be fabricated above the insulating layer 24 in the vicinity of a junction.

As described above, however, the use of the conventional technologies to implement the multilayer structure, such as the wiring layer, above the Josephson junction after forming the Josephson junction leads to a problem such as impairment of normal circuit operation due to the deterioration in the characteristics of the Josephson junction with the grain boundary, or due to the change in the characteristics of the ramp-edge Josephson junction of the surface-engineered type.

In other words, it is difficult, with the conventional technologies, to superpose a superconducting layer and an insulating layer on a superconducting layer having a Josephson junction without a deterioration or change in the junction characteristics of the Josephson junction, as well as to remove restrictions on the disposition of circuit elements, such as wiring and a coil, on the uppermost layer, and therefore to fabricate a large-scale superconducting device with excellent circuit characteristics.

SUMMARY OF THE INVENTION

The present invention has been made in consideration of the above-mentioned limitations of the conventional technologies. An object of the present invention is to provide a superconducting device of a multilayer structure without deterioration or change in characteristics of a Josephson junction and a method of manufacturing the superconducting device, in the case where oxide superconducting thin films and oxide insulating layers are superposed on one another to implement a large-scale superconducting circuit.

As previously mentioned, to fabricate a large-scale SFQ circuit or a highly-sensitive SQUID sensor of a complicated structure, it is essential to achieve a device having a multilayer structure, and to fabricate a circuit element, such as wiring or a coil, above the junction layer. However, with the conventional technologies, it is difficult to superpose a superconducting layer and an insulating layer on a superconducting layer having a Josephson junction without causing deterioration or change in junction characteristics of the Josephson junction, as well as to fabricate a circuit element, such as wiring or a coil, on the uppermost layer. It is therefore difficult, with the conventional technologies, to fabricate a large-scale superconducting device with excellent circuit characteristics.

To overcome the above-mentioned limitations of the conventional technologies, the inventor of the present invention has made keenly researched on a method for implementing a multilayer structure including a superconducting layer and an insulating layer, as well as for fabricating a circuit element, such as a wiring or a coil, on the uppermost layer without causing deterioration or change in junction characteristics of a Josephson junction.

As a result, the inventor has found out that a required number of Josephson junctions having required junction characteristics can be formed in required positions without causing the junctions to be affected by the influence of a heating process, if the Josephson junction is formed concurrently with the time when an upper most superconducting layer is superposed.

The present invention has been made on the basis of the above findings. A summary of the present invention is as follows.

(1) A superconducting device of a multilayer structure in which an oxide superconducting thin film and an oxide insulating thin film are alternately superposed on each other on an insulating substrate, and which includes a Josephson junction, wherein
 (i) the Josephson junction is formed by forming at least one of junction electrodes concurrently with the time when an uppermost-level oxide superconducting thin film layer is superposed, and
 (ii) at least the uppermost-level oxide superconducting thin film layer of the multilayer structure includes a circuit element pattern.
 (2) The superconducting device according to (1), wherein
 the insulating substrate is a bicrystal substrate, and
 the Josephson junction is a bicrystal-type Josephson junction formed on the substrate.
 (3) The superconducting device according to (1), wherein
 the insulating substrate is a bicrystal substrate, and
 types of the Josephson junction are a bicrystal-type Josephson junction formed on the substrate and a ramp-edge type Josephson junction formed of the uppermost-level oxide superconducting layer and of another oxide superconducting thin film layer.
 (4) The superconducting device according to (1), wherein the Josephson junction is a ramp-edge type Josephson junction formed of the uppermost-level oxide superconducting layer and of another oxide superconducting thin film layer.
 (5) The superconducting device according to any one of (1) to (4), wherein the circuit element is any one of a wiring and a coil.
 (6) The superconducting device according to (1), wherein the insulating substrate is a substrate having a step on a surface thereof, and
 the Josephson junction is a step-edge type Josephson junction formed on the step of the substrate.
 (7) A method of manufacturing a superconducting device, comprising the steps of:
 (i) forming a multilayer structure by alternately superposing an oxide superconducting thin film and an oxide insulating thin film on an insulating substrate;
 (ii) removing a portion of the multilayer structure, in which a Josephson junction is to be formed, thereby forming any one of a space where the oxide superconducting thin film and the oxide insulating thin film are exposed, and a space where the oxide superconducting thin film, the oxide insulating thin film and the insulating substrate are exposed, the space having a cross section of any one of a concave shape and a shape of an inverted trapezoid; and
 (iii) superposing an uppermost-level oxide superconducting thin film as a circuit layer including a circuit element, and forming the Josephson junction in the portion by also superposing the oxide superconducting thin film on the exposed thin films in the space.
 (8) The method of manufacturing a superconducting device according to (7), wherein
 the insulating substrate is a bicrystal substrate, and
 the multilayer structure is removed down to the substrate, and thereby a bicrystal-type Josephson junction is formed on the substrate.
 (9) The method of manufacturing a superconducting device according to (7), wherein
 the insulating substrate is a bicrystal substrate,
 the multilayer structure is removed down to the substrate, and thereby a bicrystal-type Josephson junction is formed on the substrate, and
 a ramp-edge type Josephson junction is formed with another oxide superconducting thin film layer.
 (10) The method of manufacturing a superconducting device according to (7), wherein the Josephson junction is a ramp-edge type Josephson junction formed with another oxide superconducting thin film layer.
 (11) The method of manufacturing a superconducting device according to any one of (7) to (10), wherein the circuit element is any one of a wiring and a coil.
 (12) The method of manufacturing a superconducting device according to (7), wherein
 the insulating substrate is a substrate having a step on a surface thereof,
 the multilayer structure is removed down to the substrate, and
 a step-edge type Josephson junction is formed on the step of the substrate.

According to the present invention, the Josephson junction is formed concurrently with the time when the uppermost-level superconducting thin film layer is superposed in the last superposing step involving the heating of the substrate. This makes it possible to prevent junction characteristics from deteriorating or changing due to the barrier layer being affected by the influence of the heat at the time when the substrate is heated. Thereby, the superconducting device can be made to have the multilayer structure. In addition, according to the present invention, the uppermost-level oxide superconducting thin film layer can be processed and then be used as the circuit layer including the circuit element.

BRIEF DESCRIPTION OF THE DRAWINGS

FIGS. 17A to 17I are cross-sectional views of a superconducting device according to a fourth embodiment of the present invention as in the process of being manufactured.

FIGS. 18A to 18F are plan views of the superconducting device according to the fourth embodiment of the present invention as in the process of being manufactured.

DESCRIPTION OF THE PREFERRED EMBODIMENTS

The present invention is characterized in that, in the case of fabricating a superconducting device of a multilayer structure in which oxide superconducting thin film and oxide insulating thin film are alternately superposed on one another on an insulating substrate, a Josephson junction is formed concurrently with the time when the uppermost-level oxide superconducting thin film layer is superposed, and that the uppermost-level oxide superconducting thin film layer is processed and then is used as a circuit layer including a circuit element. With reference to the accompanying drawings, descriptions will be given below of concepts of technologies underlying the present invention.

(Fabrication of Bicrystal Junction)

Figure 1A:
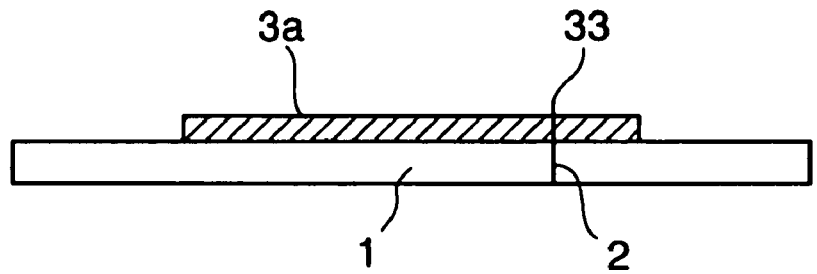
FIGS. 1A and 1B are a cross-sectional view and a plan view, respectively, of a structure of a superconducting device according to a conventional technology (Part 1).
Figure 1B:
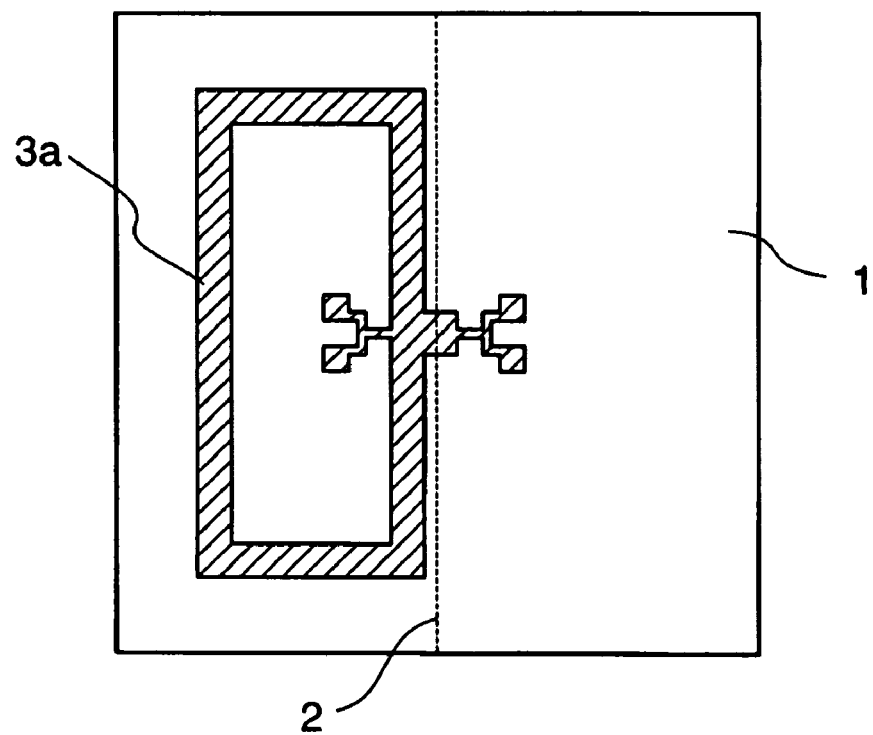
Figure 2A:
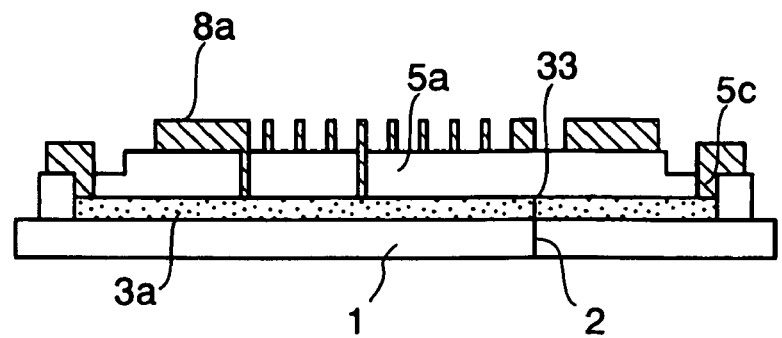
FIGS. 2A and 2B are a cross-sectional view and a plan view, respectively, of a structure of a superconducting device according to a conventional technology (Part 2).
Figure 2B:
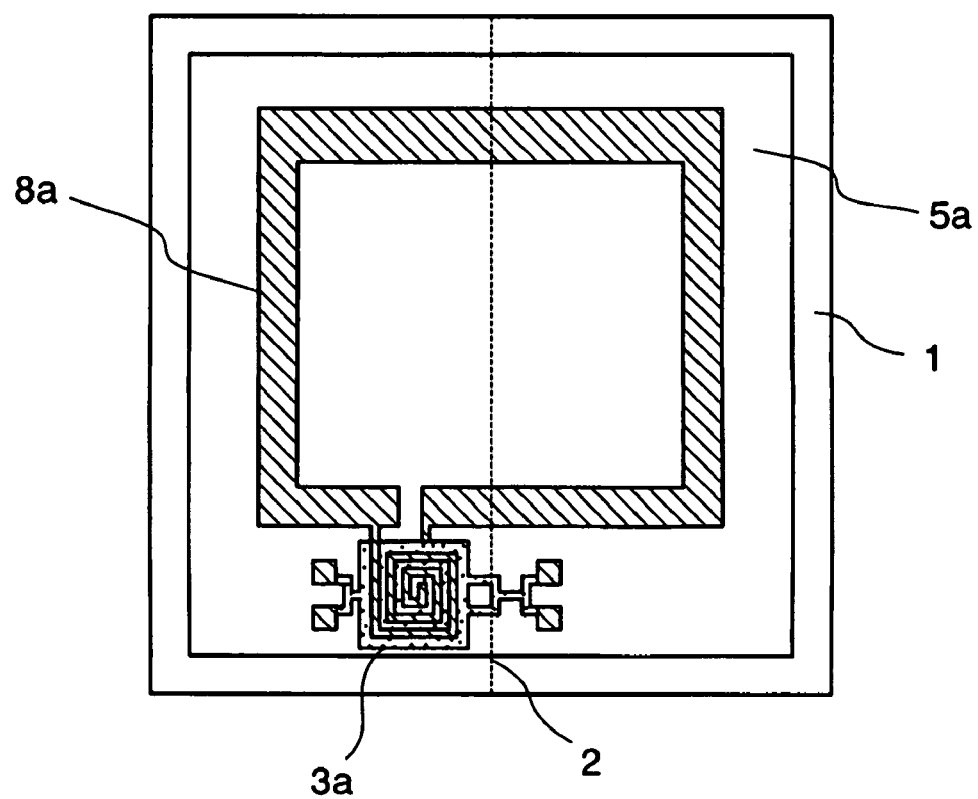
Figure 3A:
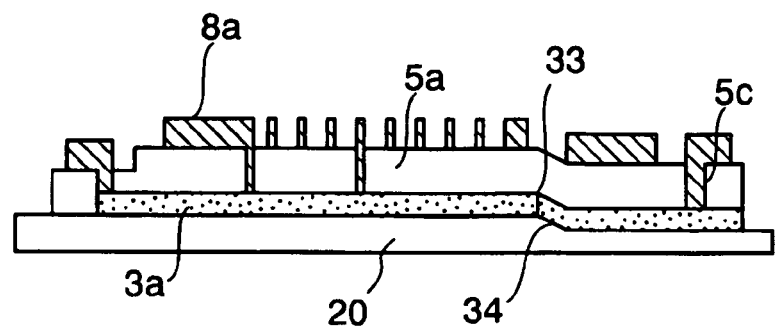
FIGS. 3A and 3B are a cross-sectional view and a plan view, respectively, of a structure of a superconducting device according to a conventional technology (Part 3).
Figure 3B:
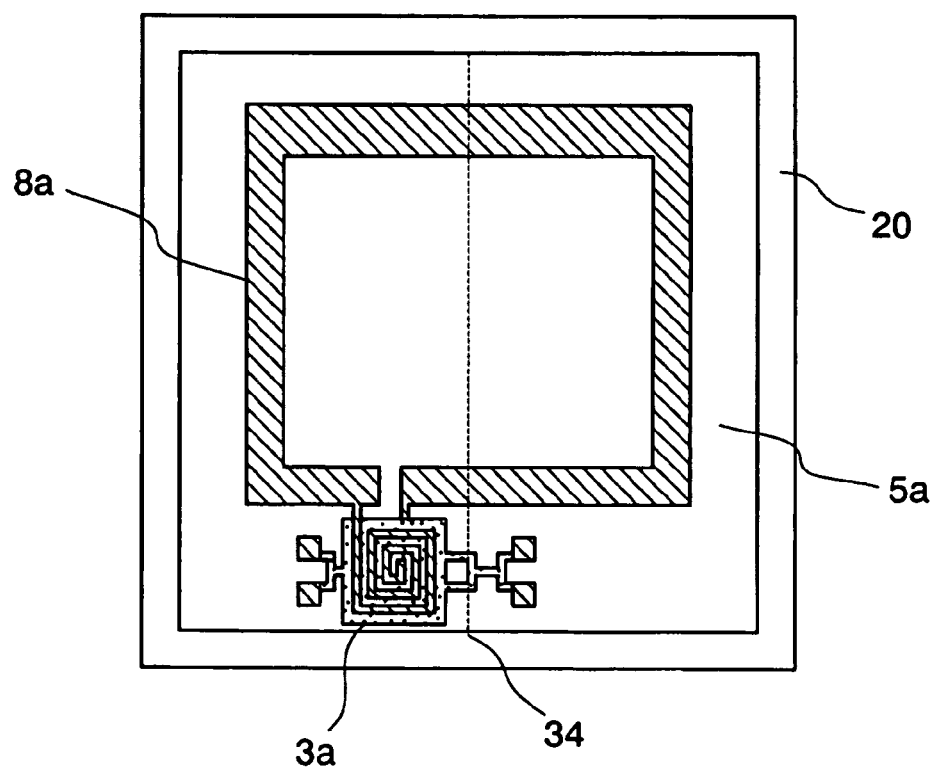
Figure 4A:
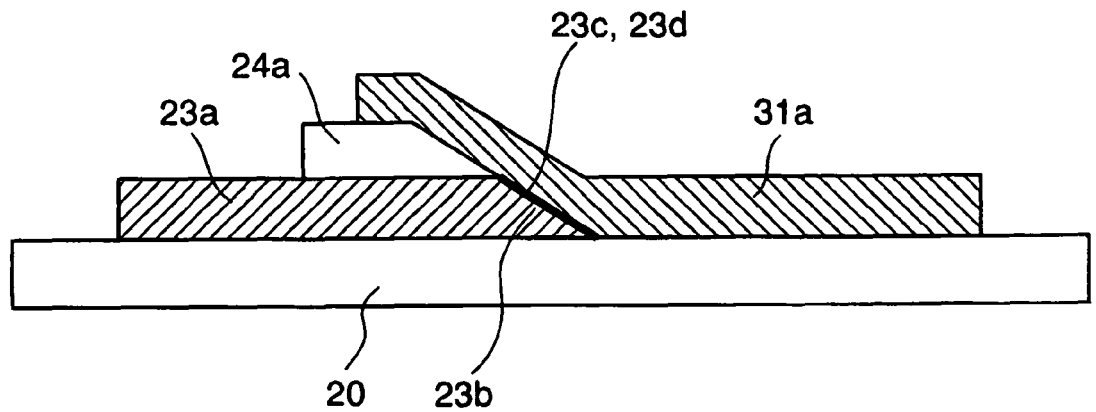
FIGS. 4A and 4B are a cross-sectional view and a plan view, respectively, of a structure of a superconducting device according to a conventional technology (Part 4).
Figure 4B:
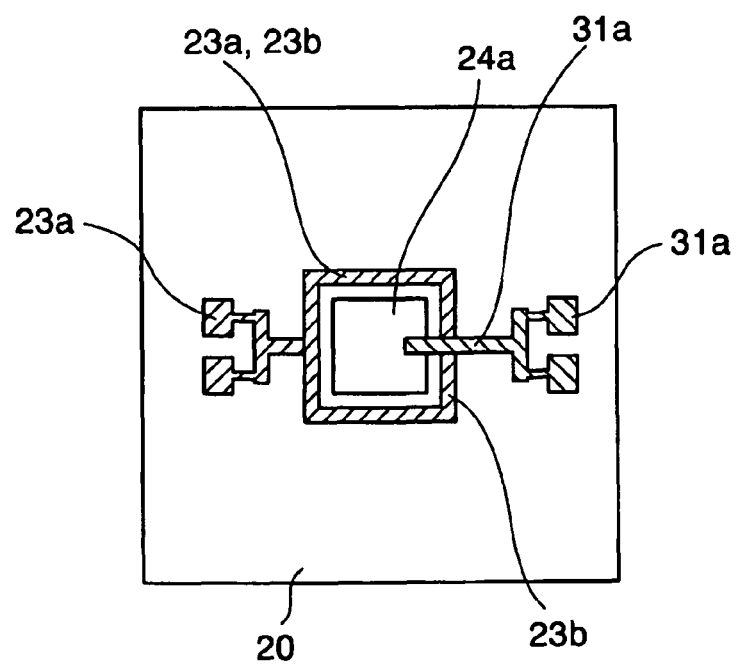
Figure 5A:
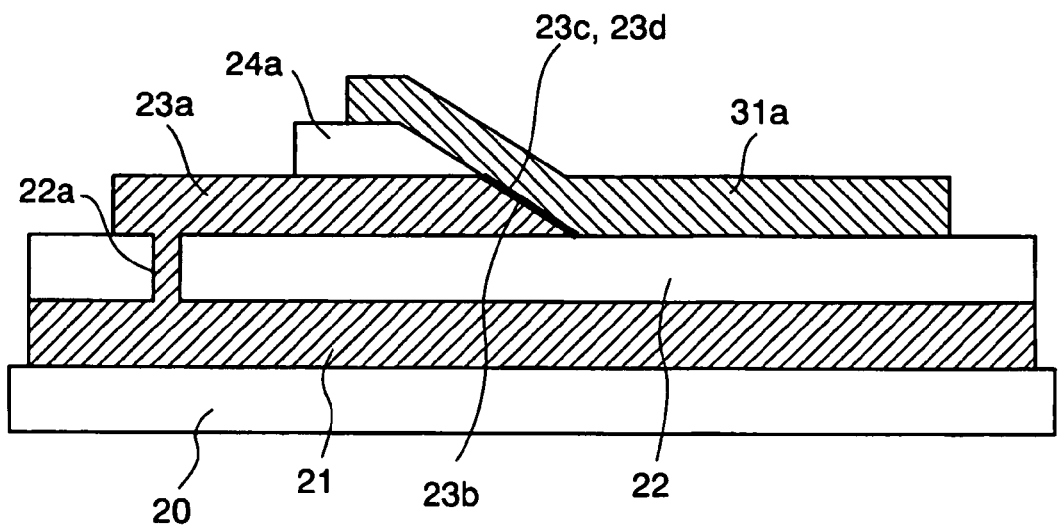
FIGS. 5A and 5B are a cross-sectional view and a plan view, respectively, of a structure of a superconducting device according to a conventional technology (Part 5).
Figure 5B:
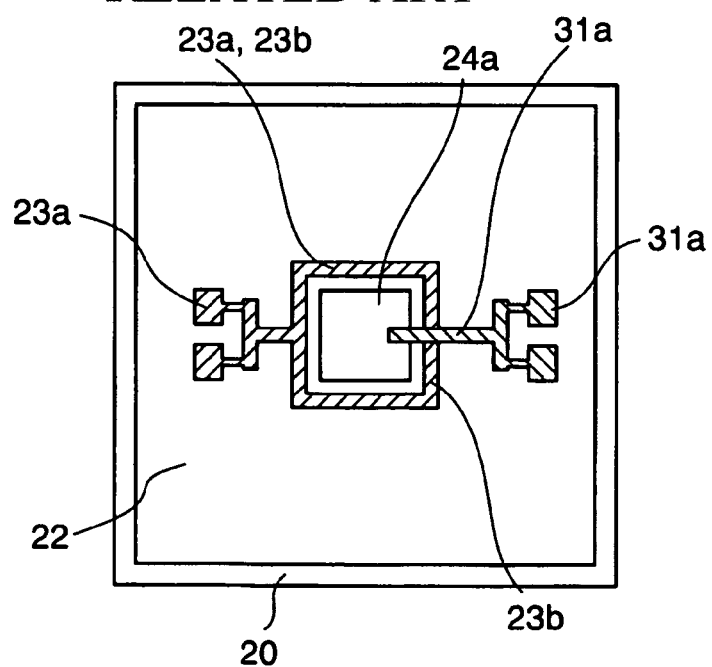
Figure 5C:
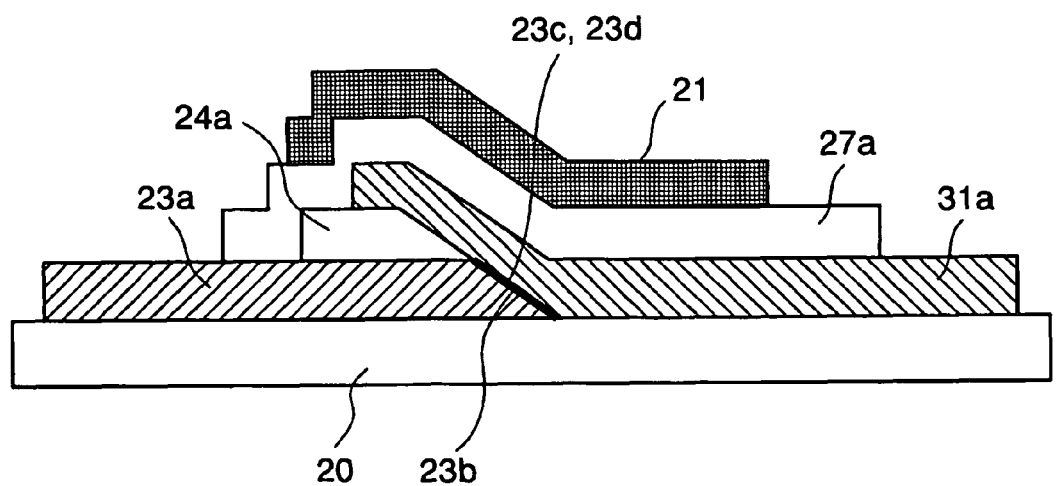
FIG. 5C is a cross-sectional view of a superconducting device according to a conventional technology (Part 6).
Figure 6A:
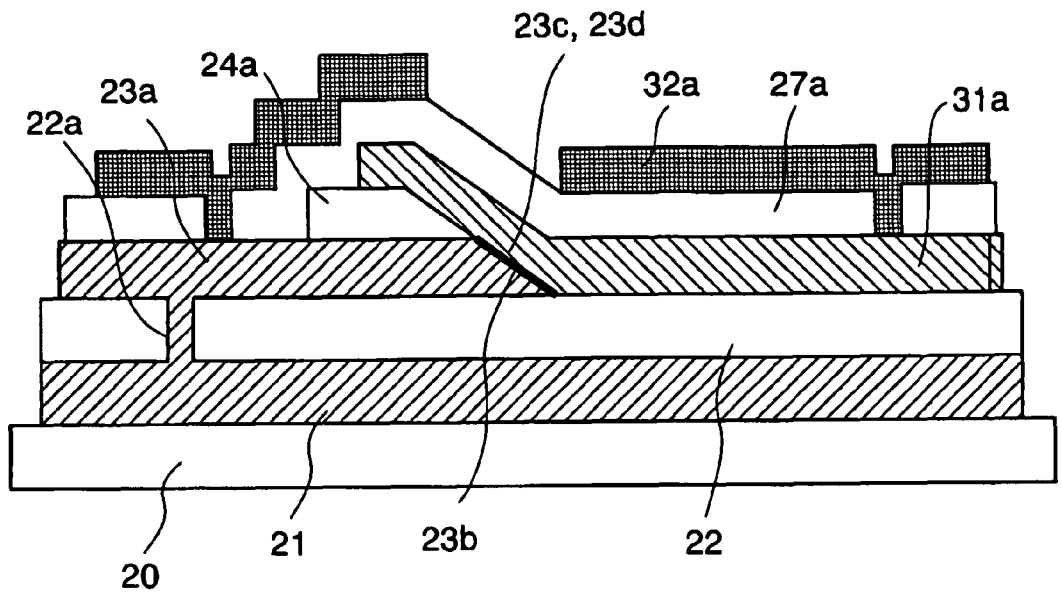
FIGS. 6A and 6B are a cross-sectional view and a plan view, respectively, of a multilayer structure of a superconducting device according to a conventional technology (Part 7).
Figure 6B:
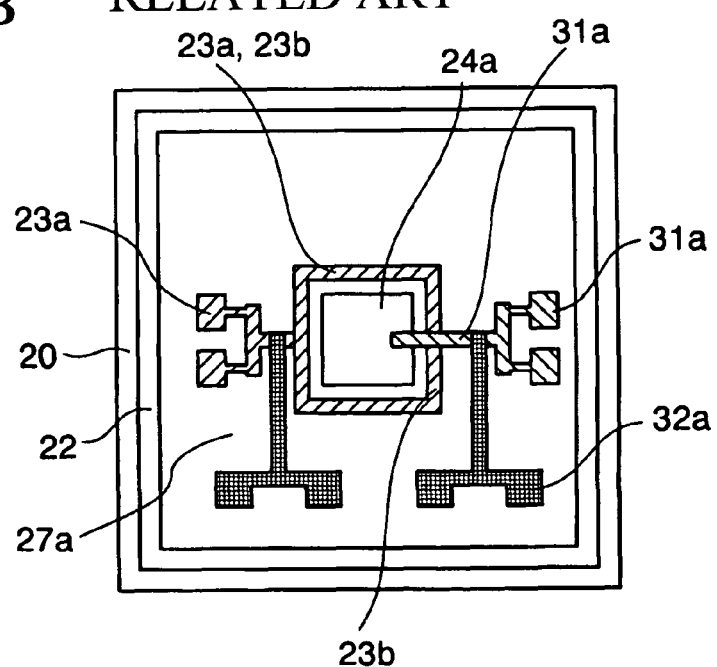
Figure 7A:
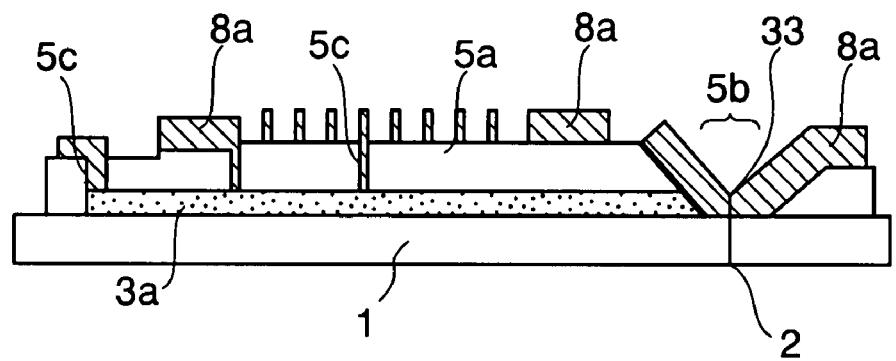
FIGS. 7A and 7B are a cross-sectional view and a plan view, respectively, of a multilayer structure of a superconducting device according to the present invention (Part 1).
Figure 7B:
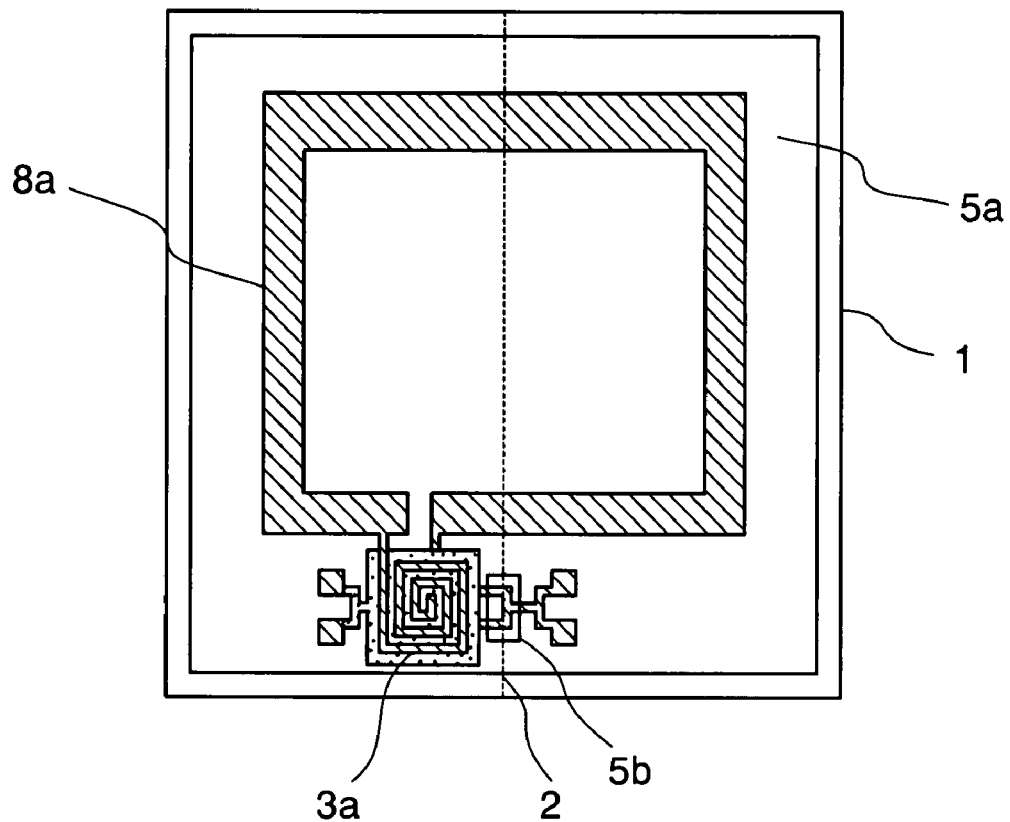

FIGS. 7A and 7B illustrate a multilayer structure in which two layers of superconducting thin films $3a$, $8a$ and one layer of insulating thin film $5a$ are deposited on an insulating bicrystal substrate 1 provided with a bicrystal line 2. FIGS. 7A and 7B show a cross-sectional view and a plan view, respectively, of the multilayer structure.

An insulating layer $5a$ is deposited on a first superconducting layer $3a$ on which a pattern is formed. Then, the bicrystal line of the substrate is exposed by removing the first superconducting layer $3a$ and the insulating layer $5a$ which are present on the bicrystal line 2 used for forming a junction. Thereafter, a superconducting thin film grain boundary 33, serving a part of the bicrystal-type Josephson junction, is formed by forming a second-level superconducting layer $8a$ by deposition. Subsequently, another Josephson junction and a coil portion are fabricated by patterning the second-level superconducting layer $8a$.

In this case, there is no deterioration or change in junction characteristics due to the heat, because a substrate heating process for heating the substrate after fabricating the bicrystal-type Josephson junction is absent. Thus, it is possible to keep a Josephson junction having good junction characteristics. It is also possible to fabricate a circuit element such as a wiring or a coil above the insulating layer. As a result, an improvement in SQUID characteristics is achieved by the multilayer structure and excellent junction characteristics thereof.

As described above, the present invention makes it possible to provide a superconducting device of a multilayer structure which includes a first superconducting pattern formed on a substrate, an insulating pattern formed on the first superconducting pattern, and a second superconducting pattern which is the uppermost-level superconducting pattern formed on the insulating pattern, which has a barrier layer of a Josephson junction formed below or in the pattern, and in which a circuit element is formed.

In the multilayer structure of the superconducting device shown in FIGS. 7A and 7B, the second superconducting pattern is the uppermost layer. In the present invention, however, the n-th superconducting pattern may be the uppermost layer. In other words, the present invention is characterized in that, after forming the first to the (n−1)th superconducting patterns, a required number of Josephson junctions are formed in required positions concurrently with the uppermost-level n-th superconducting pattern.

Thus, the Josephson junction according to the present invention maintains excellent junction characteristics as they are at the time of formation of the junction, because the barrier layer is not affected by the influence of heat due to the substrate heating process for forming the first to the (n−1)th superconducting patterns, unlike the Josephson junction fabricated with conventional technologies.

Descriptions will be given below, from the viewpoint of a fabrication process, of reasons why the Josephson junction according to the present invention can maintain excellent junction characteristics as they are at the time of formation of the junction.

The superconducting device of the multilayer structure shown in FIGS. 7A and 7B is fabricated through the following steps: a step of forming the first superconducting pattern on the bicrystal substrate; a step of forming a first insulating pattern on the first superconducting pattern (both of these steps require the heating of the substrate); a step of exposing the bicrystal line by removing the first superconducting pattern and the first insulating pattern which are on the bicrystal line of the bicrystal substrate; and a step, as the last step requiring the heating of the substrate, of forming the uppermost-level second superconducting pattern which includes the barrier layer formed of the grain boundary along the bicrystal line, and which can constitute the circuit element.

In the manufacturing method including the above steps, the step of forming the second superconducting pattern is the last step involving the heating of the bicrystal substrate. Thus, the step of exposing the Josephson junction to heat is not carried out after forming the second superconducting pattern. Accordingly, constituent elements that constitute the insulating pattern layer or the like would not be diffused into the barrier layer by thermal energy, and thereby the junction characteristics would not be deteriorated.

Specifically, the Josephson junction configured of the first and second superconducting patterns and the barrier layer is not affected, during the manufacture of the superconducting device, by the influence of thermal energy that may possibly cause deterioration in the junction characteristics. Hence, the Josephson junction maintains excellent junction characteristics as they are at the time of formation of the junction, and thereby makes it possible to achieve a large-scale superconducting circuit which includes the Josephson junction having the multilayer structure and excellent junction characteristics.

(Fabrication of Step-Edge Junction)

Figure 8A:
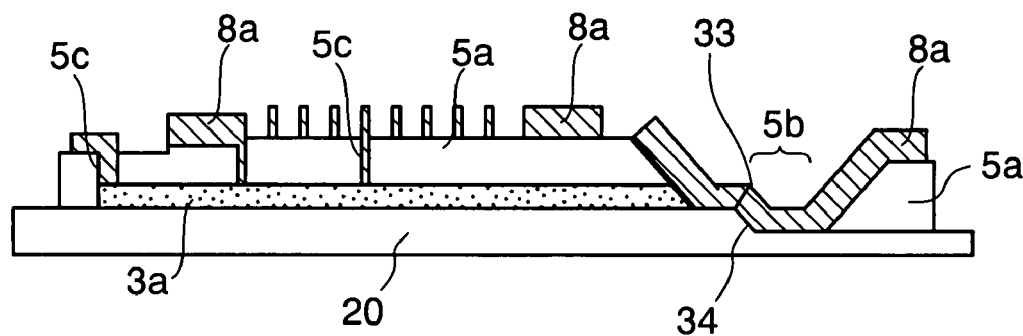
FIGS. 8A and 8B are a cross-sectional view and a plan view, respectively, of a multilayer structure of a superconducting device according to the present invention (Part 2).
Figure 8B:
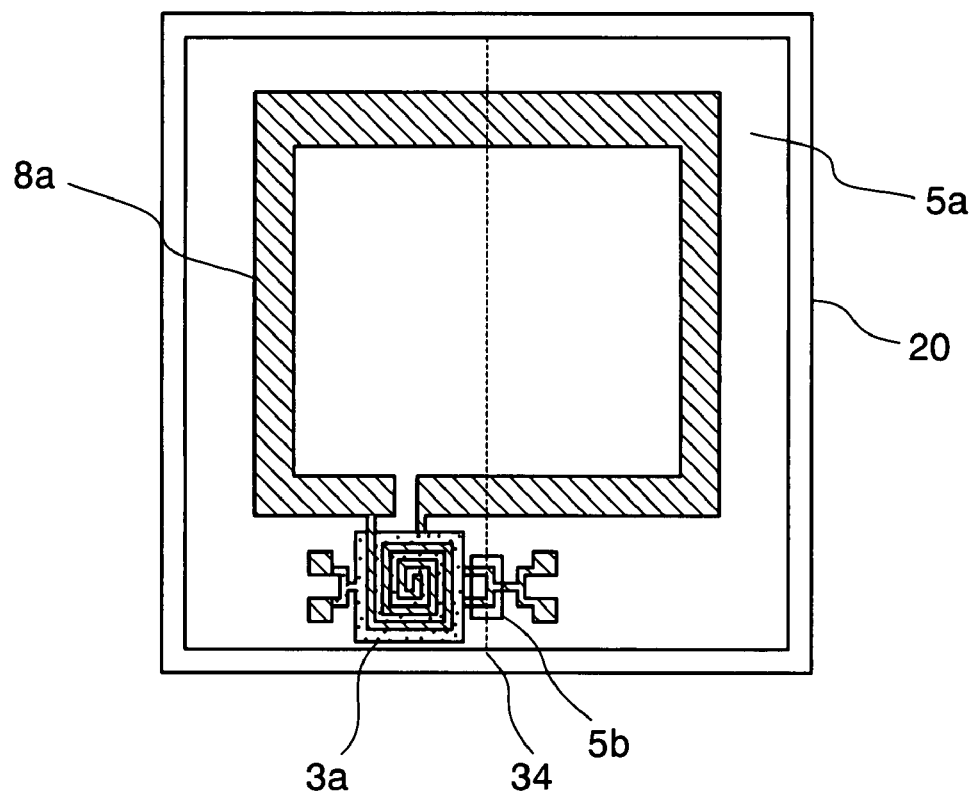

FIGS. 8A and 8B illustrate a multilayer structure in which two layers of superconducting thin films $3a$, $8a$ and one layer of insulating thin film $5a$ are deposited on an insulating substrate 20 provided with a step edge 34. FIGS. 8A and 8B show a cross-sectional view and a plan view, respectively, of the multilayer structure.

The insulating layer 5a is deposited on the first superconducting layer 3a in which the pattern is formed. Then, the step edge 34 of the substrate 20 is exposed by removing the first superconducting layer 3a and the insulating layer 5a that lie on the step edge 34 used for forming the junction. Thereafter, the superconducting thin film grain boundary 33, serving as a part of step-edge type Josephson junction, is formed by depositing the second-level superconducting layer 8a. Subsequently, another Josephson junction and the coil portion are fabricated by patterning the second-level superconducting layer 8a.

In this case, deterioration or change due to thermal energy does not occur in junction characteristics because of the absence of the substrate heating process after fabricating the step-edge type Josephson junction. Thus, it is possible to form a Josephson junction having good junction characteristics. It is also possible to fabricate a circuit element, such as a wiring or a coil, on the insulating layer 5a. As a result, an improvement in SQUID characteristics is achieved by the multilayer structure and excellent junction characteristics thereof.

(Fabrication of Ramp Edge Junction)

Descriptions will now be given of the case where a Josephson junction is a ramp-edge junction of an interface-modified type.

Figure 9A:
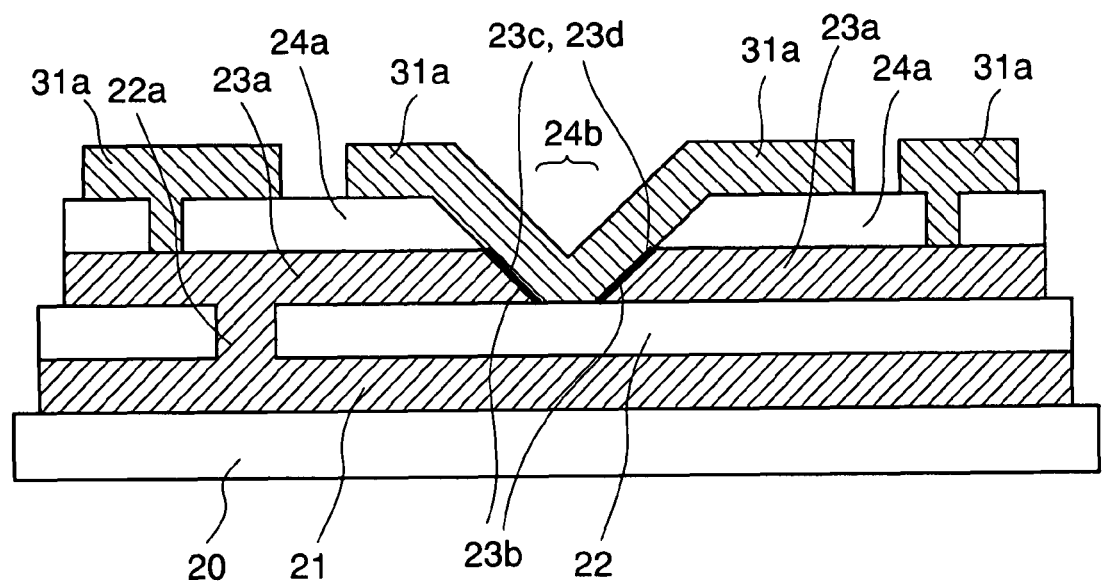
FIGS. 9A and 9B are a cross-sectional view and a plan view, respectively, of a multilayer structure of a superconducting device according to the present invention (Part 3).
Figure 9B:
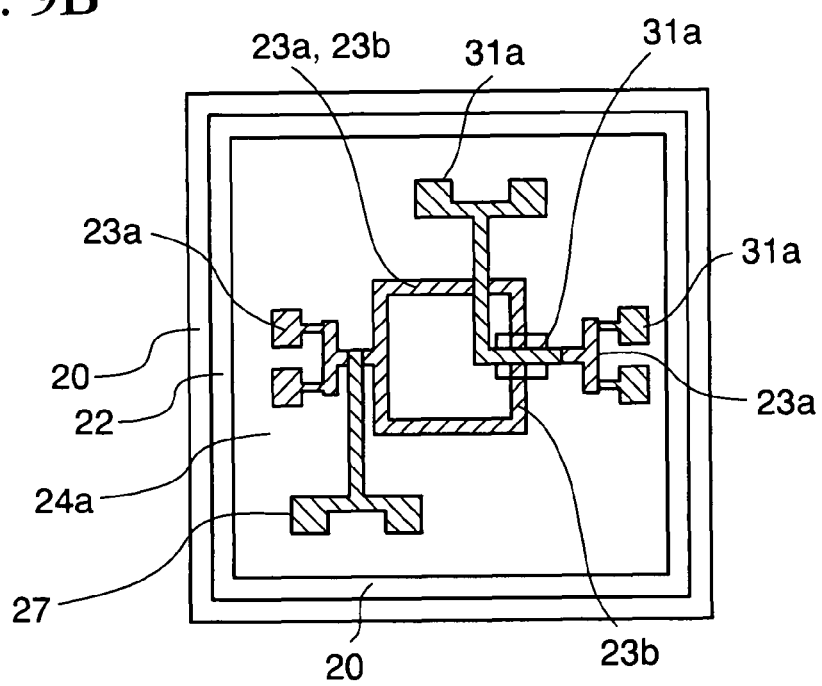

FIGS. 9A and 9B illustrate a structure in which a ground plane 21 of an oxide superconducting thin film is present below a junction layer, and in which an upper wiring structure is present above the junction layer. FIGS. 9A and 9B show a cross-sectional view and a plan view, respectively, of the multilayer structure. A first superconducting layer 23a, in which a junction is to be formed, is deposited, and then an insulating layer 24a is deposited on the first superconducting layer 23a. Thereafter, an underlying insulating layer 22, which is present on the ground plane 21, is exposed by removing portions of the respective first superconducting layer 23a and the insulating layer 24a, which are present in a position in which the junction is to be formed.

Here, a tapered surface 23b and an amorphous layer 23c of the ramp-edge junction of the interface-modified type are formed. Then, a second-level superconducting layer 31a is deposited, and then the amorphous layer 23c is reformed to form a barrier layer 23d for a ramp-edge junction. Then, the Josephson junction and a wiring portion are fabricated by patterning the second-level superconducting layer 31a.

In this case, values of junction characteristics are not different from designed values because of the absence of the substrate heating process after fabricating the junction. As a result, it is possible to form the ramp-edge type Josephson junction having good junction characteristics as the designed values. Moreover, it is possible to fabricate a circuit element, such as upper wiring, on the insulating layer 24a. This makes it possible to achieve a large-scale circuit with a multilayer structure.

The process for fabricating the ramp-edge junction of the surface-engineered type according to the present invention includes the following steps: a step of forming the first superconducting layer on the substrate; a step of forming the insulating pattern on the first superconducting layer; a step of forming the first superconducting pattern provided with the inclined surface, by etching the first superconducting layer with the insulating pattern used as a mask; a step of forming, on the inclined surface, the amorphous layer that is a base of the barrier for a ramp-edge junction; and a step, as the last step involving the heating of the substrate, of forming the upper-most-level second superconducting pattern on the insulating pattern and on the inclined surface for a ramp-edge junction. Here, the circuit element may be constituted in the second superconducting pattern.

The step of forming the second superconducting pattern is the last step involving the heating of the substrate. Thus, it is possible to avoid junction characteristics of the Josephson junction configured of the first and second superconducting patterns and of the barrier layer for a ramp-edge junction from being deteriorated by the influence of thermal energy due to the heating of the substrate. This makes it possible to achieve a superconducting device of a multilayer structure which includes a Josephson junction having good junction characteristics as the designed values.

With reference to the drawings, detailed descriptions will be further given below of the present invention.

An effective way to fabricate a superconducting device having a large-scale circuit is to form a superconducting pattern of a multilayer structure, by forming a lower-level superconducting pattern, and then by forming an upper-level superconducting pattern.

However, the step of forming the superconducting pattern involves the heating of the substrate, as previously mentioned. For this reason, if the upper-level superconducting pattern is formed after the Josephson junction is formed, the Josephson junction may possibly be deteriorated because of the thermal energy due to the heating of the substrate at the time of forming the upper-level superconducting pattern.

Consequently, in the case of forming the superconducting pattern to have the multilayer structure, it is therefore necessary to specify a process for forming the multilayer structure and a process for forming the junction in a predetermined order so as to form the Josephson junction concurrently with the upper-level superconducting pattern.

Embodiments of the present invention will be described below.

(1) First Embodiment

Detailed descriptions will be given of superconducting devices according to the embodiments of the present invention, following a series of steps in a manufacturing process therefor.

In the first embodiment, a grain boundary is formed within a superconducting layer along a bicrystal line of a bicrystal substrate. This grain boundary is used as a barrier layer of a Josephson junction.

FIGS. 10A to 10I are cross-sectional views of the superconducting device according to the first embodiment in the process of being manufactured. FIGS. 11A to 11D are plan views of the superconducting device shown in FIGS. 10A to 10I.

Figure 10A:
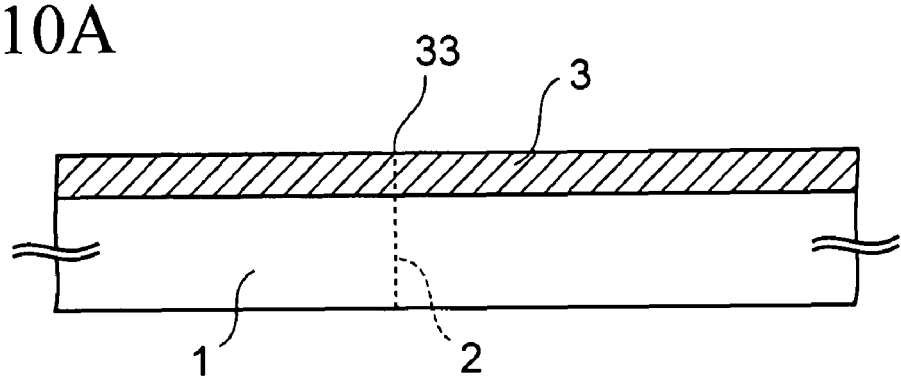
FIGS. 10A to 10I are cross-sectional views of a superconducting device according to a first embodiment of the present invention as in the process of being manufactured.

First, as shown in FIG. 10A, a $Y_1Ba_2Cu_3O_{7-x}$ (YBCO) layer with the thickness of about 200 nm is formed as a first superconducting layer 3 on a bicrystal substrate 1 made of $SrTiO_3$ (STO) by using the pulse laser deposition (PLD) method. The first superconducting layer 3 is formed at a substrate temperature of 740° C. in an atmosphere of oxygen. Incidentally, the first superconducting layer 3 only needs to be an oxide superconducting layer, and is not limited to the YBCO layer.

Moreover, instead of the pulse laser deposition method, sputtering method may be employed to form the first superconducting layer 3. Also in the case of employing the sputtering method, the substrate needs to be heated to form the first superconducting layer 3 made of an oxide.

The bicrystal substrate 1 is formed of two $SrTiO_3$ crystal substrates bonded together with a bicrystal line 2 interposed in between. The angle between the two $SrTiO_3$ crystal orientations is 30°. However, a material for the bicrystal substrate 1 and the angle of the junction thereof are not limited to the above. For example, an oxide insulating substrate, such as a MgO substrate or a $LaAlO_3$ (LAO) substrate, may be used for the bicrystal substrate 1. The angle of the junction of the bicrystal substrate 1 may be set at 24° or 36°, instead of 30°.

Figure 11A:
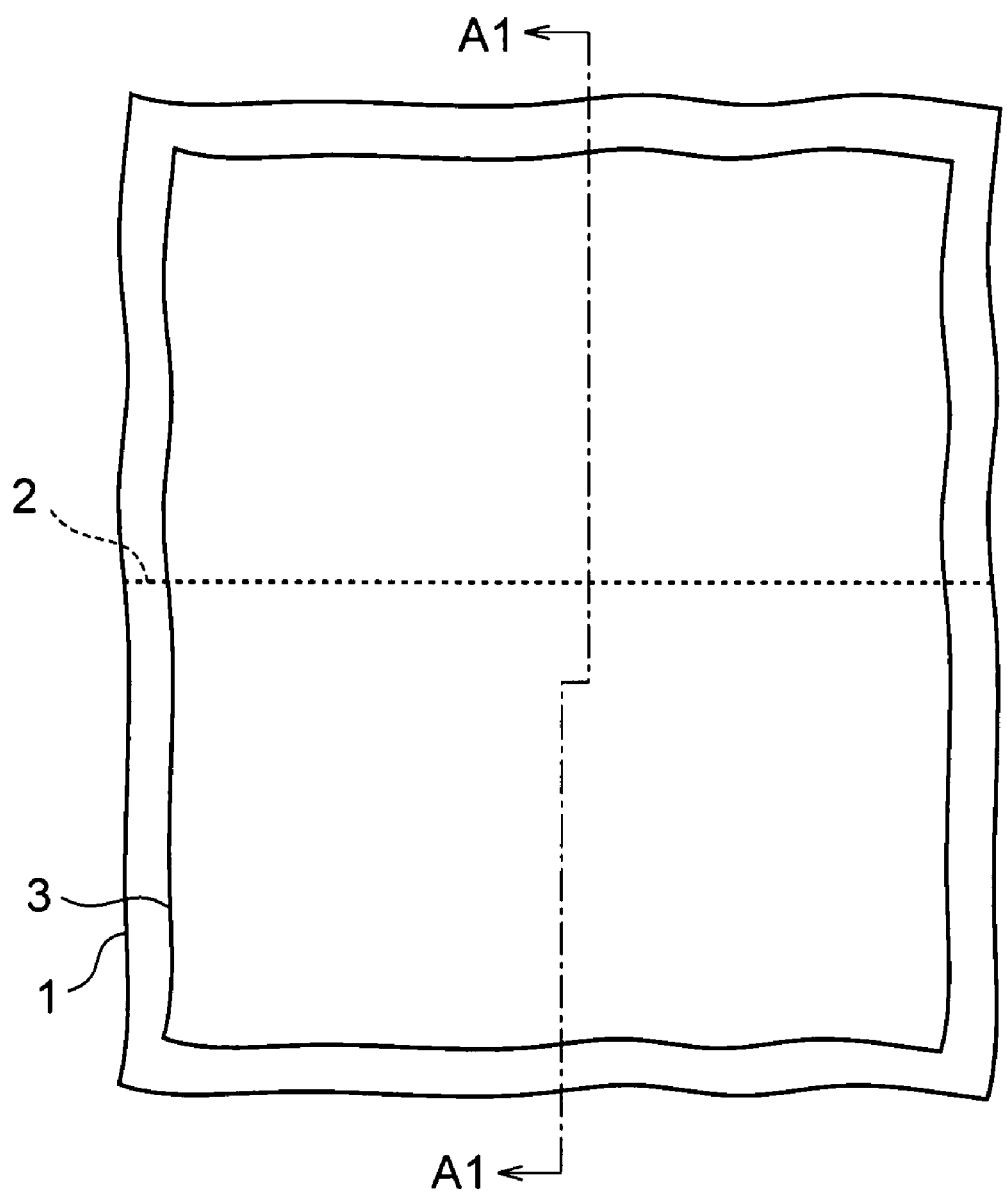
FIGS. 11A to 11D are plan views of the superconducting device according to the first embodiment of the present invention as in the process of being manufactured.

FIG. 11A is a plan view in a state after the completion of the above step. FIG. 10A corresponds to a cross-sectional view taken along the line A1-A1 of FIG. 11A.

Figure 10B:
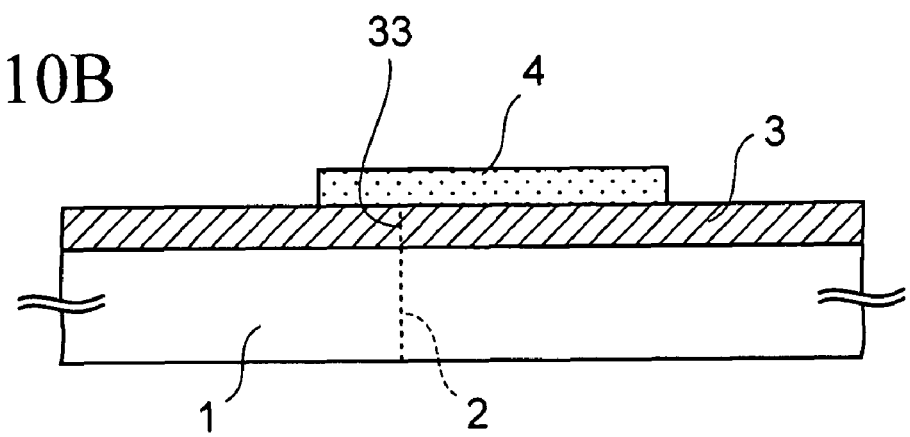
Figure 10C:
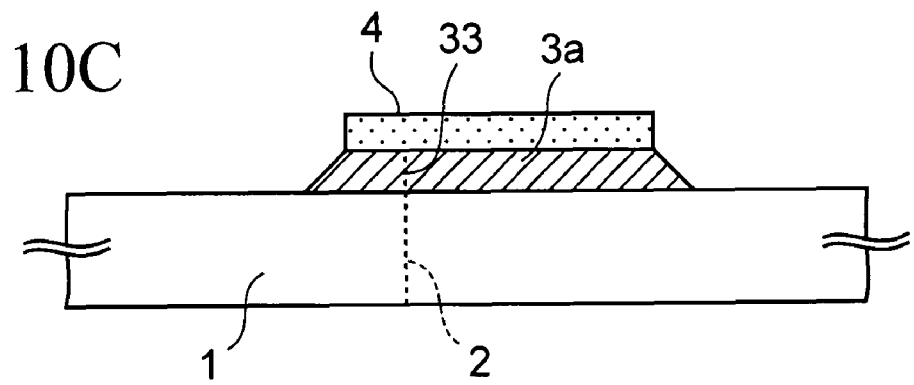

Then, as shown in FIG. 10B, a first resist pattern 4 of a predetermined shape is formed on the first superconducting layer 3. A first superconducting pattern 3a as shown in FIG. 10C is formed by etching the first superconducting layer 3 by Ar ion milling using the first resist pattern 4 as a mask. After the etching, the first resist pattern 4 is removed.

Figure 11B:
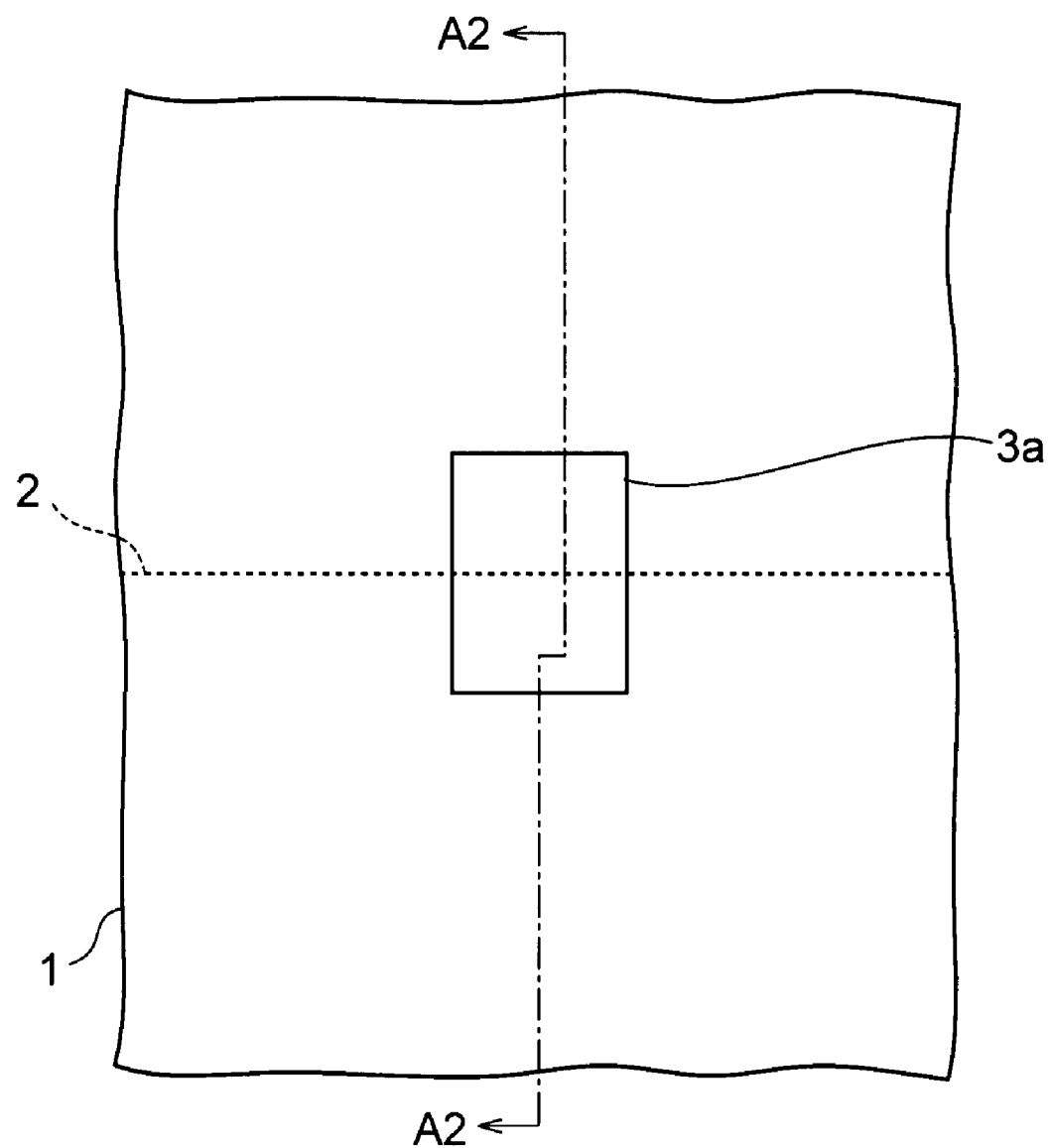

FIG. 11B is a plan view of a superconducting pattern in a state after the completion of the above step. FIG. 10C corresponds to a cross-sectional view taken along the line A2-A2 of FIG. 11B.

Figure 10D:
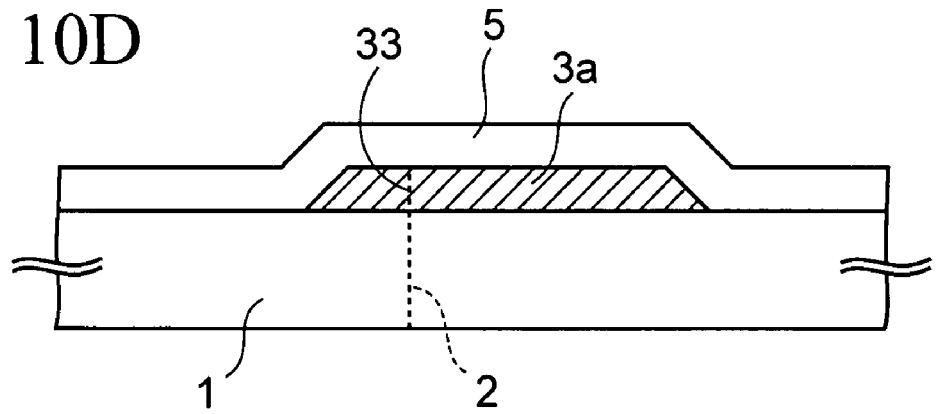

Subsequently, as shown in FIG. 10D, a $CeO_2$ layer with the thickness of about 400 nm is formed as an insulating layer 5 on the first superconducting pattern 3a and on the bicrystal substrate 1 by using the pulse laser deposition method. In the present embodiment, the insulating layer 5 is deposited at a substrate temperature of 640° C. in an atmosphere of oxygen, although the conditions for forming the insulating layer 5 are not particularly limited.

Figure 10E:
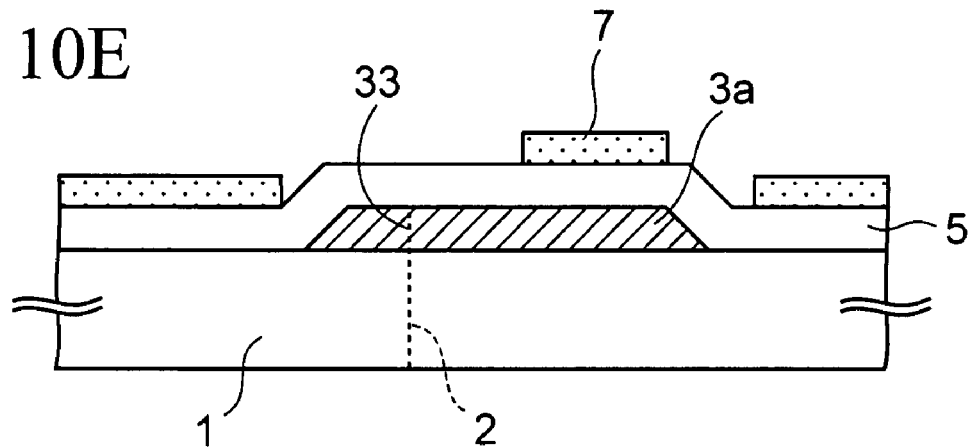

Then, as shown in FIG. 10E, a second resist pattern 7 is formed on the insulating layer 5.

Figure 10F:
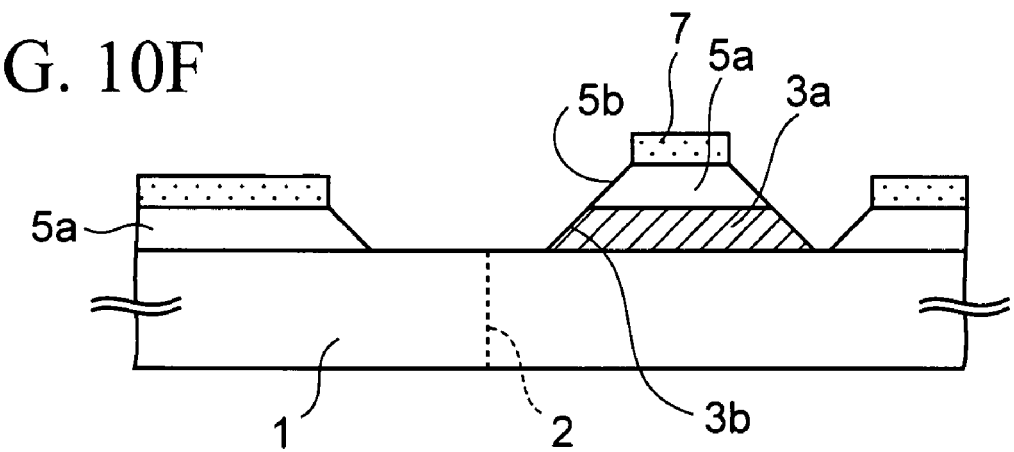

Thereafter, as shown in FIG. 10F, an insulating pattern 5a provided with an opening 5b through which the bicrystal line 2 is exposed, is formed by etching the insulating layer 5 by Ar ion milling using the second resist pattern 7 as a mask.

Furthermore, the bicrystal line 2 is exposed by removing the first superconducting pattern 3a under the opening 5b by Ar ion milling using the second resist pattern 7 and the insulating pattern 5a as masks.

In the above etching, a side surface of the second resist pattern 7 is recessed by Ar ions. Therefore, after the completion of the etching, an edge of the first superconducting pattern 3a under the opening 5b becomes a tapered surface 3b. Thereafter, the second resist pattern 7 is removed.

Figure 11C:
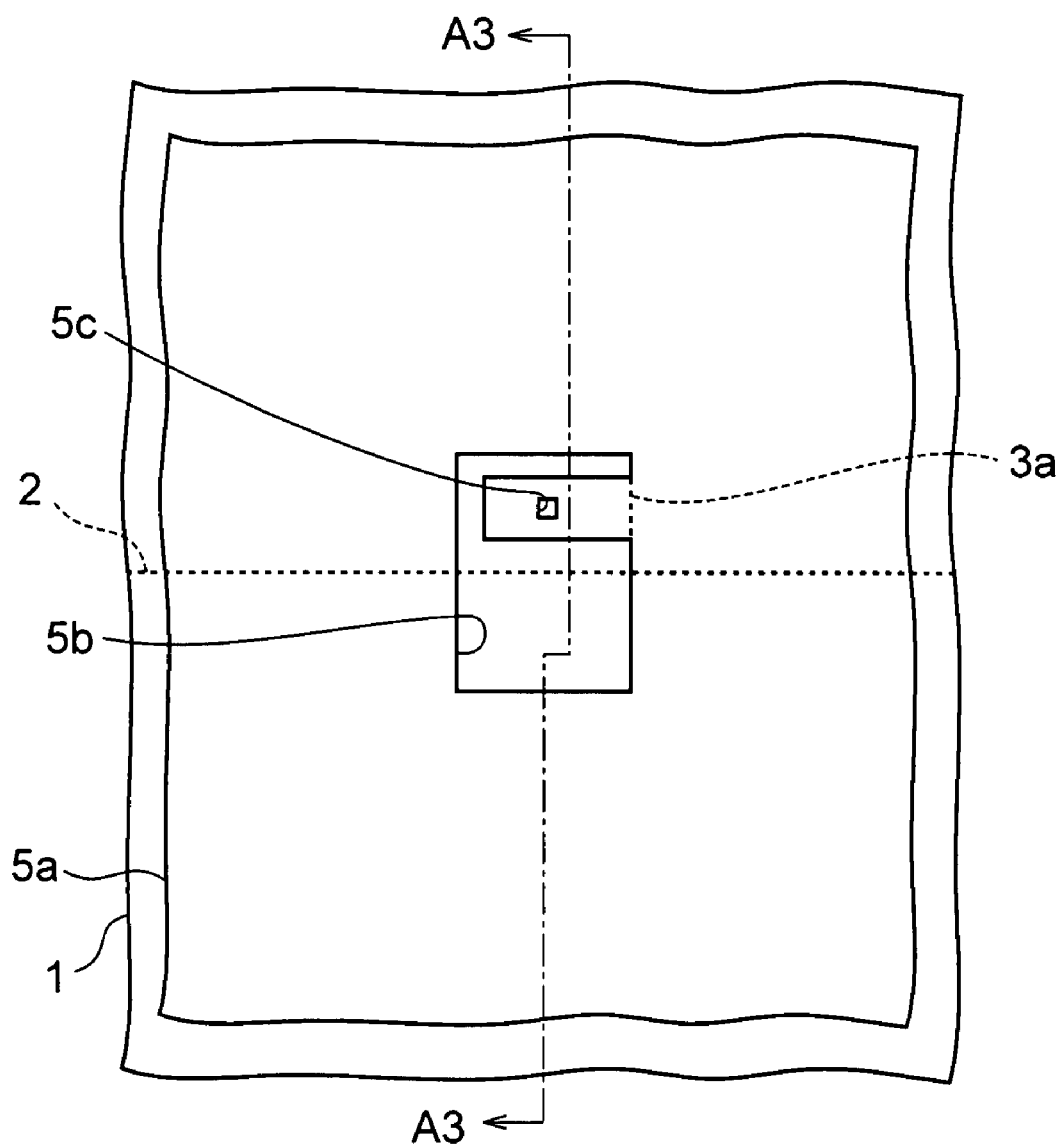

FIG. 11C is a plan view in a state after the completion of the above step. FIG. 10F corresponds to a cross-sectional view taken along the line A3-A3 of FIG. 11C.

As shown in FIG. 11C, with the above etching, a contact hole 5c is formed in the insulating pattern 5a on the first superconducting pattern 3a concurrently with the formation of opening 5b. Thereby, the first superconducting pattern 3a is exposed from the contact hole 5c.

Figure 10G:
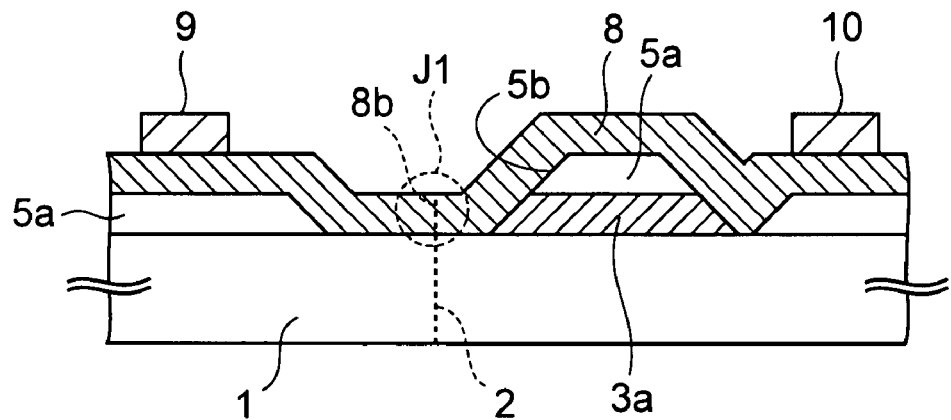

Descriptions will now be given of the steps up to the step of obtaining a cross-sectional structure as shown in FIG. 10G.

First, a YBCO layer with the thickness of about 100 nm is formed on the insulating pattern 5a and on the bicrystal line 2 in the opening 5b by using the pulse laser deposition method. This YBCO layer is used as a second superconducting layer 8. This step is the last step requiring the heating of the substrate. The second superconducting layer 8 is formed at a substrate temperature of 740 C.° in an atmosphere of oxygen. Note that the second superconducting layer 8 only needs to be an oxide superconducting layer, and is not limited to the YBCO layer.

Furthermore, instead of the pulse laser deposition method, sputtering method may be employed to form the second superconducting layer 8. When using any one of these methods, the substrate needs to be heated to form the second superconducting layer 8.

As previously mentioned, the bicrystal substrate 1 is configured so that crystals thereof are oriented in different directions at the bicrystal line 2. Due to the differences in the directions of the crystals, a grain boundary, which serves as a barrier layer 8b, is formed along the bicrystal line 2 in the second superconducting layer 8. Then, the barrier layer 8b and the second superconducting layer 8 on both sides thereof constitute a Josephson junction J1.

Incidentally, the grain boundary that constitutes the barrier layer 8b is a portion where atoms are misaligned. For this reason, when the substrate 1 is heated after forming the barrier layer 8b, constituent elements of the insulating pattern 5a may possibly be diffused into the barrier layer 8b under the influence of thermal energy due to the heating of the substrate. As a result, the junction characteristics of the Josephson junction, such as a decrease in a superconducting transition temperature Tc, may possibly be deteriorated.

To deal with this problem, in the present embodiment, the formation of the second superconducting layer 8, which involves the heating of the substrate, is conducted as the final step. Moreover, in this final step, the Josephson junction is formed. Since the step involving the heating of the substrate is not carried out after the final step, the junction characteristics are made to be as good as those of designed values.

After that, first and second electrodes 9 and 10 are formed on the second superconducting layer 8 by the vapor deposition method using a metal mask (not shown). During the formation of the electrodes 9 and 10, the bicrystal substrate 1 is not heated in order to prevent the Josephson junction from deteriorating.

Figure 10H:
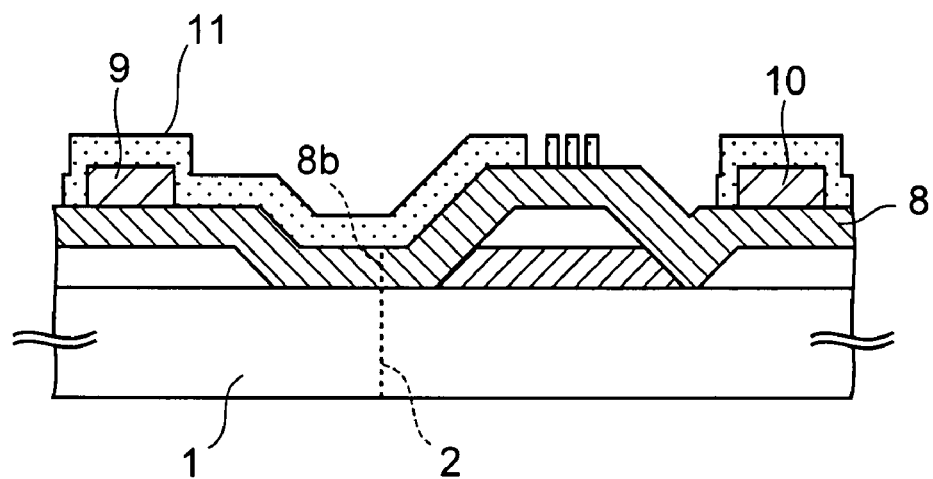

Subsequently, as shown in FIG. 10H, the second superconducting layer 8 and the electrodes 9 and 10 are coated with a photoresist. Thereafter, the photoresist is exposed by a stepper (not shown), and then is developed. Accordingly, a third resist pattern 11 is formed.

Figure 10I:
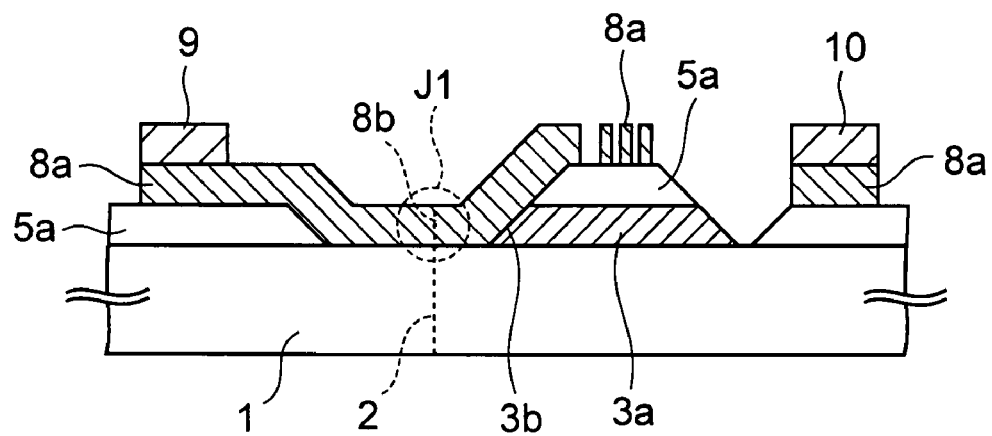

Then, as shown in FIG. 10I, a second superconducting pattern 8a is formed by etching the second superconducting layer 8 by the Ar ion milling method using the third resist pattern 11 as a mask. After that, the third resist pattern 11 is removed.

The second superconducting pattern 8a under the first electrode 9 forms a circuit layer provided with a circuit element on the insulating pattern 5a, and is electrically connected to the first superconducting pattern 3a on the tapered surface 3b at the side of the bicrystal line 2.

Figure 11D:
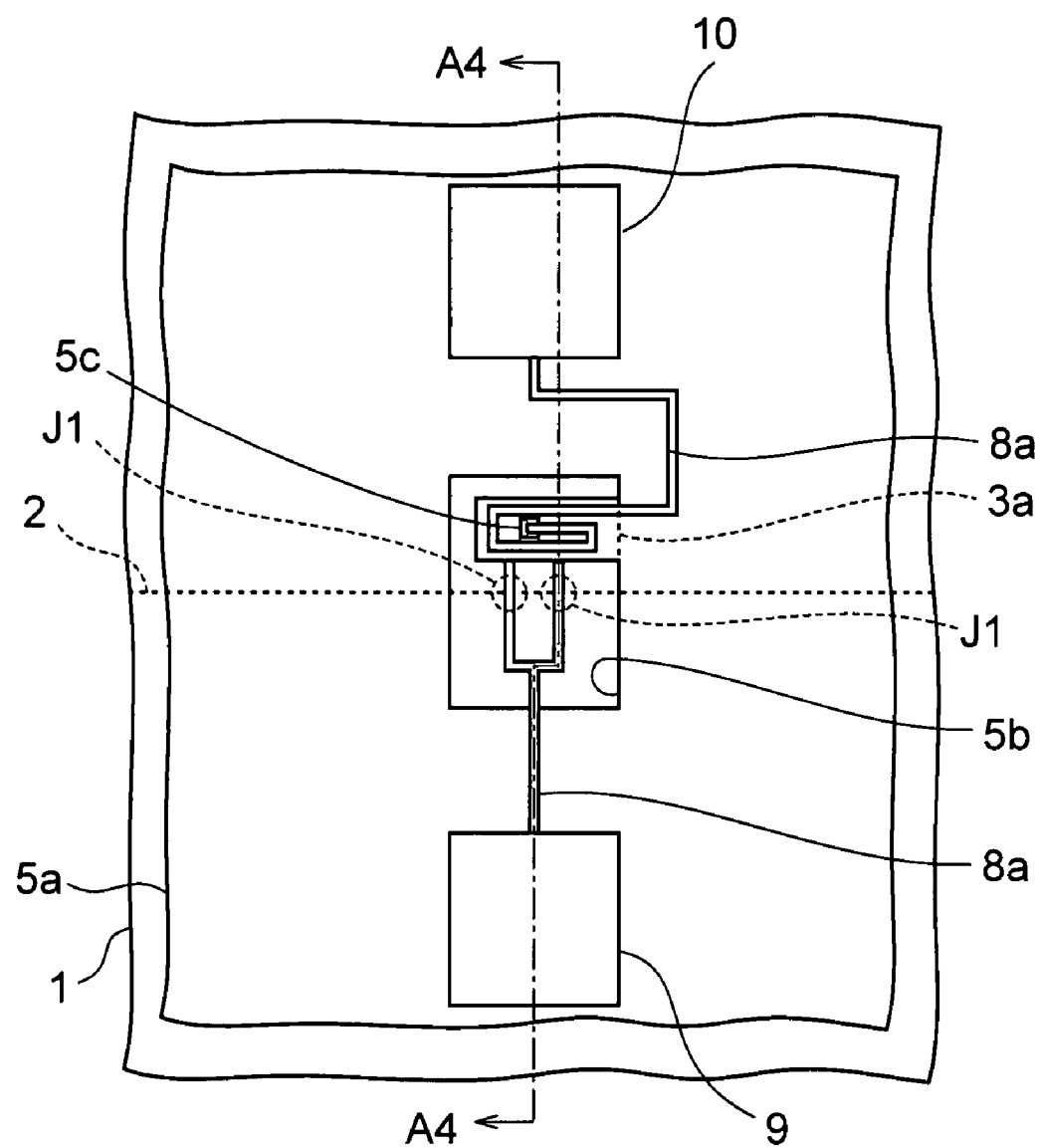

FIG. 11D is a plan view in a state after the completion of the above step. FIG. 10I corresponds to a cross-sectional view taken along the line A4-A4 of FIG. 11D.

As shown in FIG. 11D, this superconducting device is a SQUID in which two Josephson junctions J1 are formed in the second superconducting pattern 8a constituting a superconducting loop.

The second superconducting pattern 8a near the second electrode 10 is formed, as a sensing coil of the SQUID, in a helical form on the insulating pattern 5a, and is electrically connected, via the contact hole 5c, to the first superconducting pattern 3a under the contact hole 5c.

With the above steps, a basic structure of the superconducting device according to the present embodiment is completed.

In this superconducting device, as shown in FIG. 10, the first and second superconducting patterns 3a and 8a constitute the multilayer structure, and the second superconducting pattern 8a constitutes the circuit layer provided with the circuit element, such as wiring or a coil, on the insulating pattern 5a. Thus, this superconducting device is advantageous in achieving a large-scale superconducting circuit, as compared to a conventional superconducting device in which only one layer of a superconducting pattern is formed.

Moreover, in the present embodiment, after forming the barrier layer 8b in the second superconducting layer 8 (after the step shown in FIG. 10G), the second superconducting pattern 8a is formed as the uppermost-level superconducting pattern. The heating of the substrate is needed for forming the superconducting pattern. However, since the Josephson junction is formed concurrently with the time when the second superconducting pattern 8a is formed as the uppermost layer, deterioration of the barrier layer 8b due to heat does not occur. Thereby, it is made possible to form the Josephson junction of the designed values.

The inventor has conducted the following research in order to confirm that deterioration in the barrier layer 8b is actually suppressed.

Figure 12:
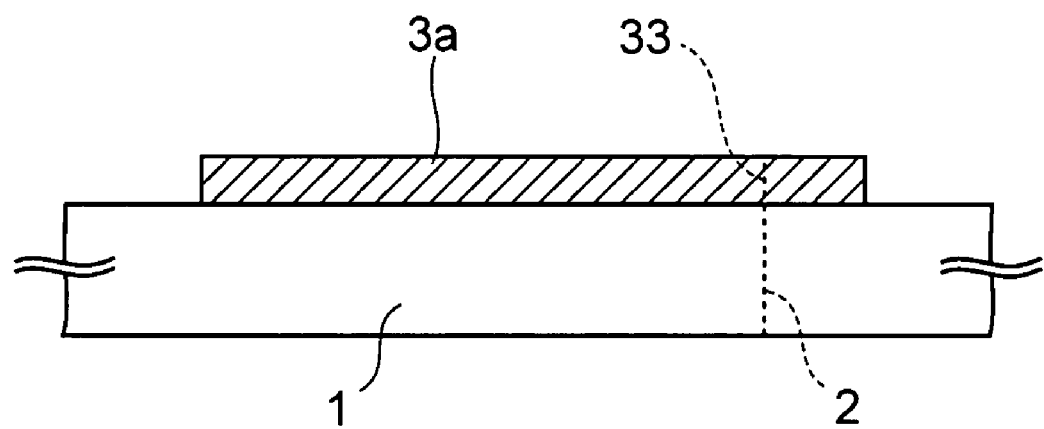
FIG. 12 is a cross-sectional view of a superconducting device according to a first comparative example.
Figure 13:
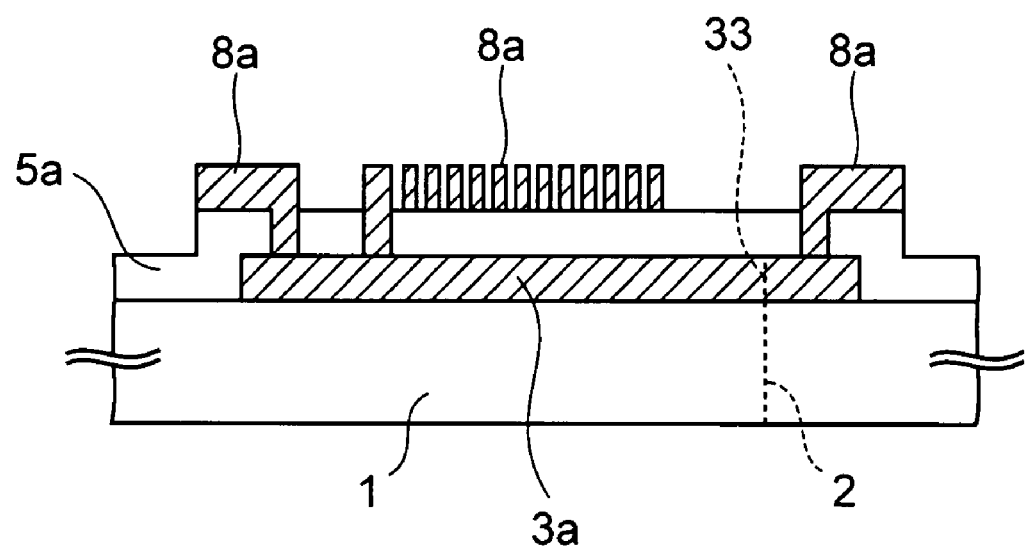
FIG. 13 is a cross-sectional view of a superconducting device according to a second comparative example.

FIGS. 12 and 13 are respectively cross-sectional views of superconducting devices according to first and second comparative examples used in this research. In FIGS. 12 and 13, the same structural components as described with reference to FIGS. 10A to 10I and to FIGS. 11A to 11D are designated by the same reference numerals, and the descriptions thereof will be hereinafter omitted.

In the first comparative example shown in FIG. 12, only a first superconducting pattern 3a provided with a superconducting thin film grain boundary 33 function as a barrier layer along a bicrystal line 2 was formed on a bicrystal substrate 1. An insulating layer or a superconducting layer, the formation of which requires the heating of the substrate, was not formed on the first superconducting pattern 3a.

In contrast, in the second comparative example shown in FIG. 13, the first superconducting pattern 3a of the first comparative example was formed, and then an insulating pattern 5a and a second superconducting pattern 8a were formed. The substrate needs to be heated to form the patterns 5a and 8a. Therefore, a superconducting thin film grain boundary 33, that is the barrier layer, was exposed to heat during heating the substrate.

Figure 14A:
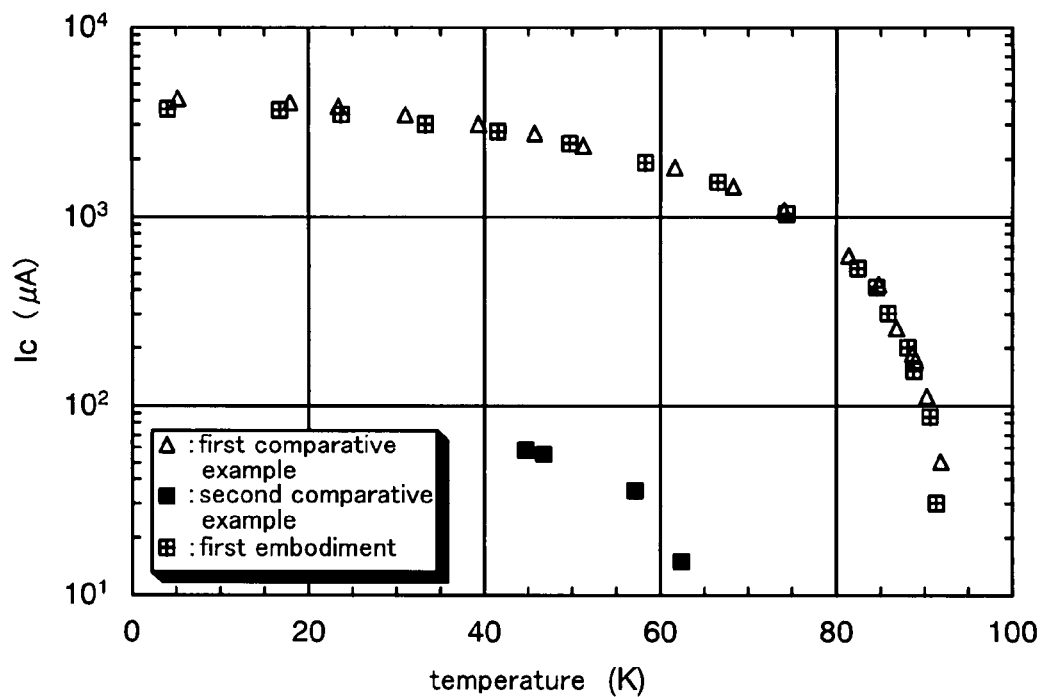
FIG. 14A is a graph obtained by checking Josephson critical currents Ic of the respective first embodiment of the present invention, the first comparative example, and the second comparative example.

FIG. 14A shows the Josephson critical currents Ic of the first embodiment, the first comparative example and the second comparative example. As shown in FIG. 14A, in the second comparative example in which the second superconducting pattern 8a was formed after the formation of the superconducting thin film grain boundary 33 functioning as the barrier layer, the Josephson critical current Ic significantly decreased. Moreover, a critical temperature Tc, which is indicated by an intersecting point of a graph and the horizontal axis, also significantly decreased.

The reason thereof is considered to be that the superconducting thin film grain boundary 33 functioning as the barrier layer was deteriorated by heat at the time of forming the second superconducting pattern 8a. Particularly, in the second comparative example, there arises a problem that the liquid nitrogen cannot be used to cool a circuit, since the critical temperature Tc is lower than the boiling point (77 K) of liquid nitrogen.

On the other hand, in the first embodiment in which the barrier layer 8b is formed concurrently with the formation of the uppermost-level second superconducting layer 8, the substrate is not heated after forming the barrier layer 8b. Thus, the Josephson critical current Ic is maintained about as high as that of the first comparative example, and the critical temperature Tc is maintained higher than the boiling point (77 K) of the liquid nitrogen.

Figure 14B:
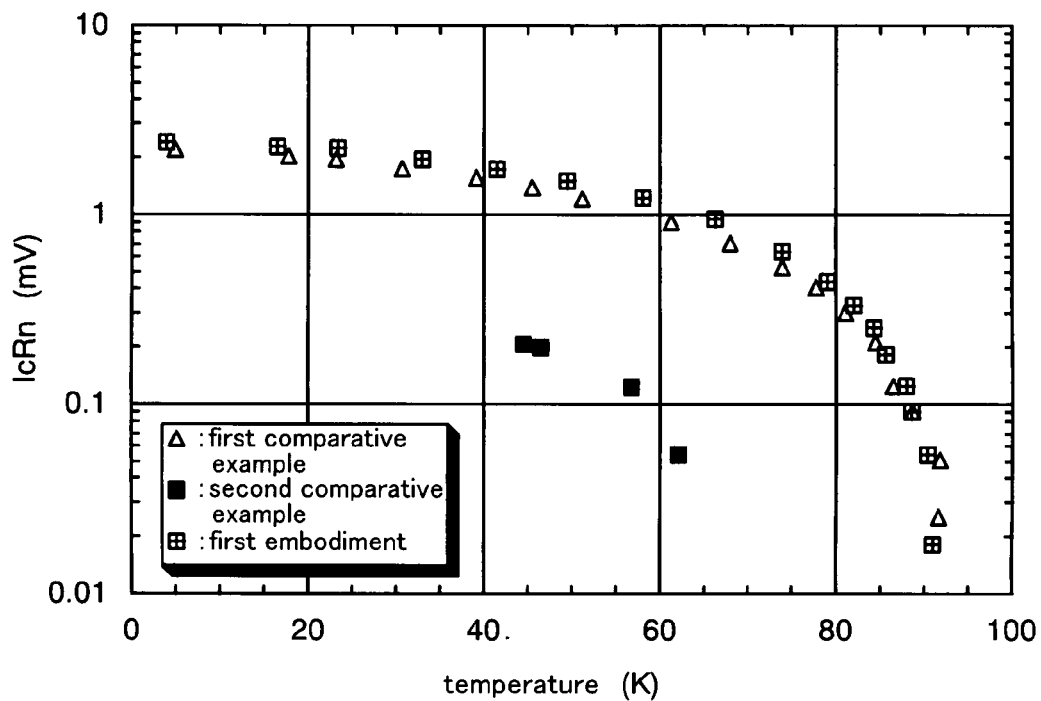
FIG. 14B is a graph obtained by checking the relationship between IcRn products and temperatures of the first embodiment and the first and of second comparative examples.

FIG. 14B shows a relationship between IcRn products and temperatures of the first embodiment and of the first and second comparative examples.

As shown in FIG. 14B, in the first comparative example in which the second superconducting pattern 8a is formed after the formation of the superconducting thin film grain boundary 33 functioning as the barrier layer, the IcRn product decreased.

In contrast, in the present embodiment, the IcRn product is maintained about as high as that of the first comparative example, and deterioration in the barrier layer 8b is suppressed.

The above results have shown that deterioration in the barrier layer 8b, which constitutes the Josephson junction J1, can be prevented when the step involving the heating of the substrate is not carried out after forming the uppermost-level second superconducting pattern 8a, as in the case of the present embodiment.

(2) Second Embodiment

Figure 15A:
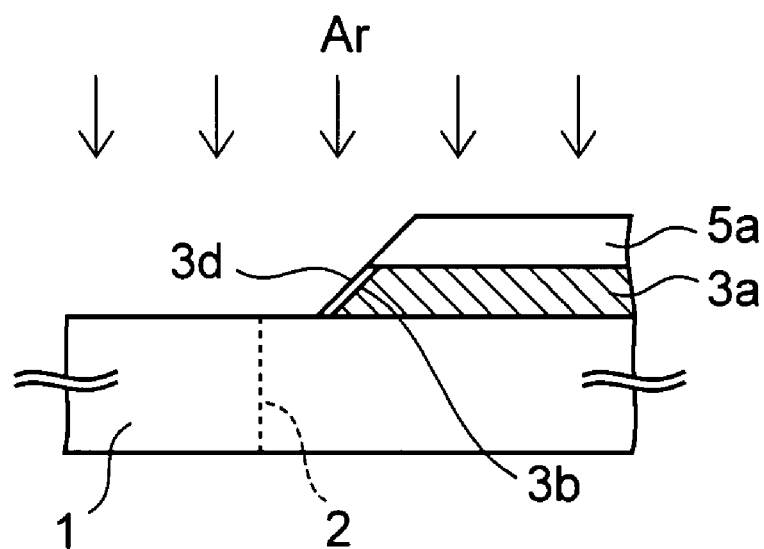
FIGS. 15A and 15B are cross-sectional views of a superconducting device according to a second embodiment of the present invention as in the process of being manufactured.
Figure 15B:
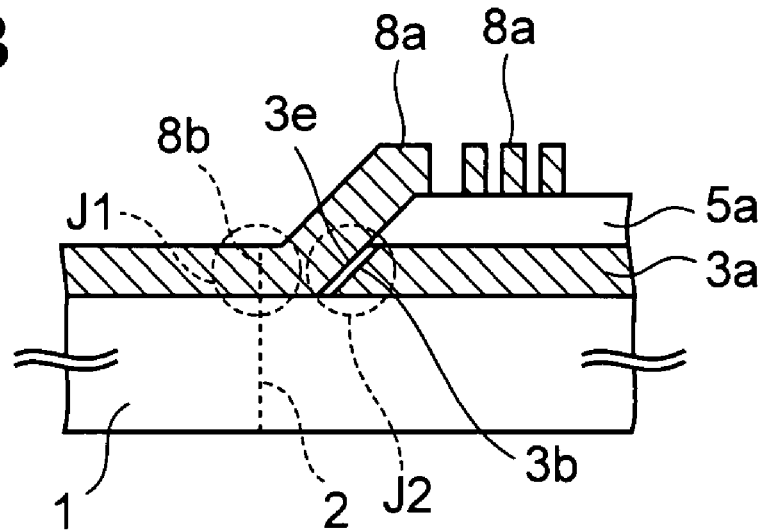

FIGS. 15A and 15B are cross-sectional views of the superconducting device according to the second embodiment in the process of being manufactured. In FIGS. 15A and 15B, the same structural components as described with reference to the first embodiment are designated by the same reference numerals as those in the first embodiment, and the descriptions thereof will be hereinafter omitted.

To fabricate the superconducting device according to the second embodiment, the steps of FIGS. 10A to 10F described in the first embodiment are initially performed.

Then, as shown in FIG. 15A, a bicrystal substrate 1 is perpendicularly irradiated with argon ions, and thereby a first superconducting pattern 3a on a ramp-edge surface 3b is modified, so that an amorphous layer 3d is formed. In the present embodiment, the conditions for argon ion irradiation are: an accelerating voltage of about 500 V; and an ion current of about 60 mA, although these conditions are not particularly limited.

Thereafter, a second superconducting pattern 8a is formed as shown in FIG. 15B, by performing the steps of FIGS. 10G to 10I described in the first embodiment.

The amorphous layer 3d is recrystallized by heat at the time of forming the second superconducting layer 8 shown in FIG. 10G, and thereby is made to be a barrier layer 3e for a ramp-edge type junction. The barrier layer 3e is also referred to as a "surface-modified type barrier layer."

The barrier layer 3e for a ramp-edge type junction and the first and second superconducting patterns 3a and 8a constitute a Josephson junction J2.

According to the present embodiment, in the step of forming the second superconducting pattern 8a, the barrier layer 3e for a ramp-edge type junction can be formed, in addition to the aforementioned barrier layer 8b.

Moreover, as in the case of the first embodiment, the step of forming the second superconducting pattern 8a is the last step requiring the heating of the substrate. Hence, the barrier layers 8b and 3e are prevented from being deteriorated by heat, and thereby the deterioration in the junction characteristics, such as a decrease in the Josephson critical current, are suppressed to the minimum.

In particular, since the surface-modified type barrier layer 3e for a ramp-edge type junction, which is formed by recrystallizing the amorphous layer 3d, may possibly be in a state where its crystallization is unstable due to the incomplete recrystallization thereof, the barrier layer 3e is prone to heat deterioration, as compared to other barrier layers such as a barrier layer made of an artificial thin film. According to the present invention, the deterioration in the surface-reformed type barrier layer due to heat can be avoided.

(3) Third Embodiment

Figure 16A:
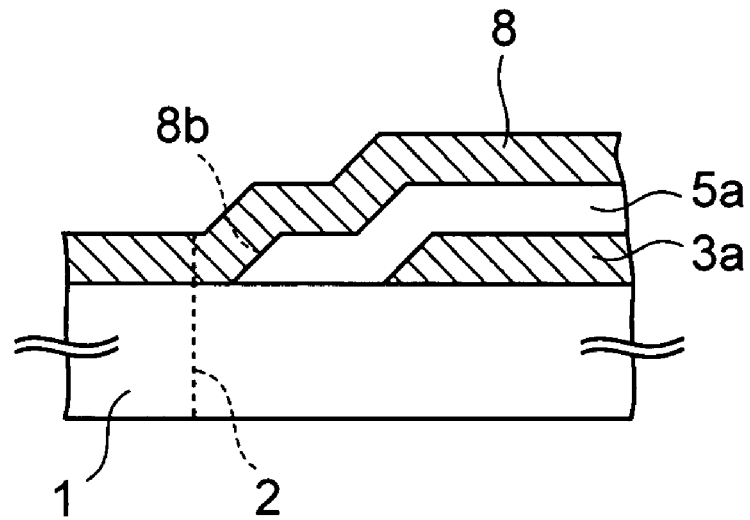
FIGS. 16A and 16B are cross-sectional views of a superconducting device according to a third embodiment of the present invention as in the process of being manufactured.
Figure 16B:
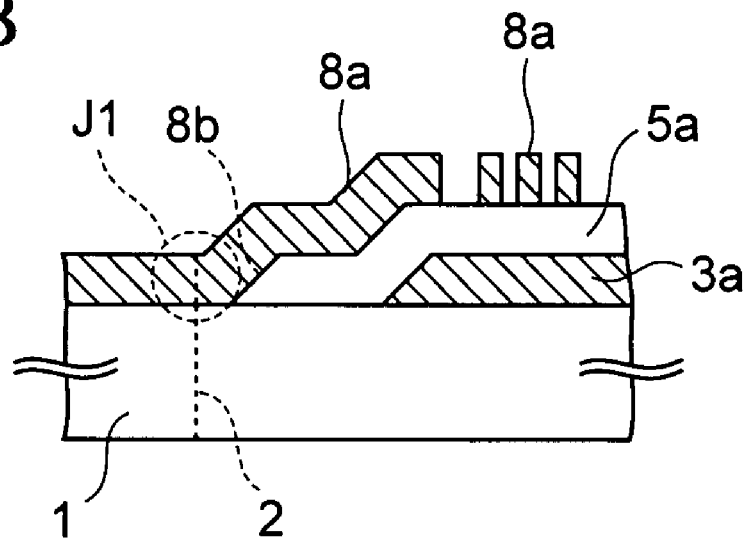

FIGS. 16A and 16B are cross-sectional views of the superconducting device according to the third embodiment in the process of being manufactured. In FIGS. 16A and 16B, the same structural components as described in the first embodiment are designated by the same reference numerals as those in the first embodiment, and the descriptions thereof will be hereinafter omitted.

First, as shown in FIG. 16A, the steps of FIGS. 10A to 10G described in the first embodiment are performed to obtain a structure in which a second superconducting layer 8 is formed on a bicrystal substrate 1 from which a bicrystal line 2 is exposed, and on an insulating pattern 5a.

In the present embodiment, however, a tapered surface 3b of a first superconducting pattern 3a is covered with the insulating pattern 5a at the time when the insulating pattern 5a is obtained by patterning an insulating layer 5 (FIG. 10F).

After that, with the aforementioned steps shown in FIGS. 10H to 10I, a second superconducting pattern 8a as shown in FIG. 16B is formed by patterning the second superconducting layer 8.

Thereafter, as in the case of the first embodiment, the step requiring the heating of the substrate, such as the step of forming an insulating layer or a superconducting layer made of an oxide, is not performed. The step of forming the second superconducting layer 8 (FIG. 10I) is the last step requiring the heating of the substrate.

The present embodiment makes it possible to achieve a structure in which the first superconducting pattern 3a and the second superconducting pattern 8a are insulated from each other by use of the insulating pattern 5a.

Moreover, as in the case of the first and second embodiments, the barrier layer 8b formed in the second superconducting pattern 8a is not deteriorated by heat because of the absence of the step requiring the heating of the substrate after forming the second superconducting pattern 8a.

(4) Fourth Embodiment

In the fourth embodiment, a ramp-edge type Josephson junction, in which a barrier layer is formed on a ramp-edge surface of a superconducting pattern, is formed.

FIGS. 17A to 17I are cross-sectional views of the superconducting device according to the fourth embodiment in the process of being manufactured. FIGS. 18A to 18F are plan views of the superconducting device shown in FIGS. 17A to 17I.

First, as shown in FIG. 17A, a lanthanum-doped YBCO layer with the thickness of about 200 nm is formed on an insulating substrate 20 made of MgO by the laser deposition method, and the lanthanum-doped YBCO layer is used as a superconducting ground plane 21.

Furthermore, a $SrSnO_3$ (SSO) layer with the thickness of about 300 nm is formed on the ground plane 21 by the pulse laser deposition method, and is used as an underlying insulating layer 22.

Figure 17C:
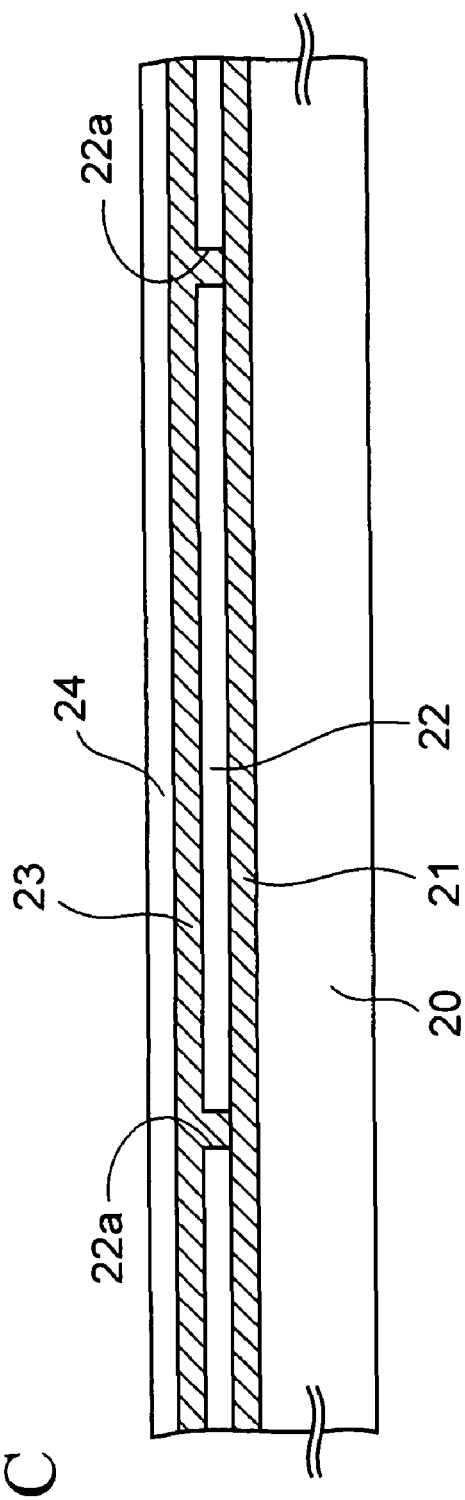
Figure 18A:
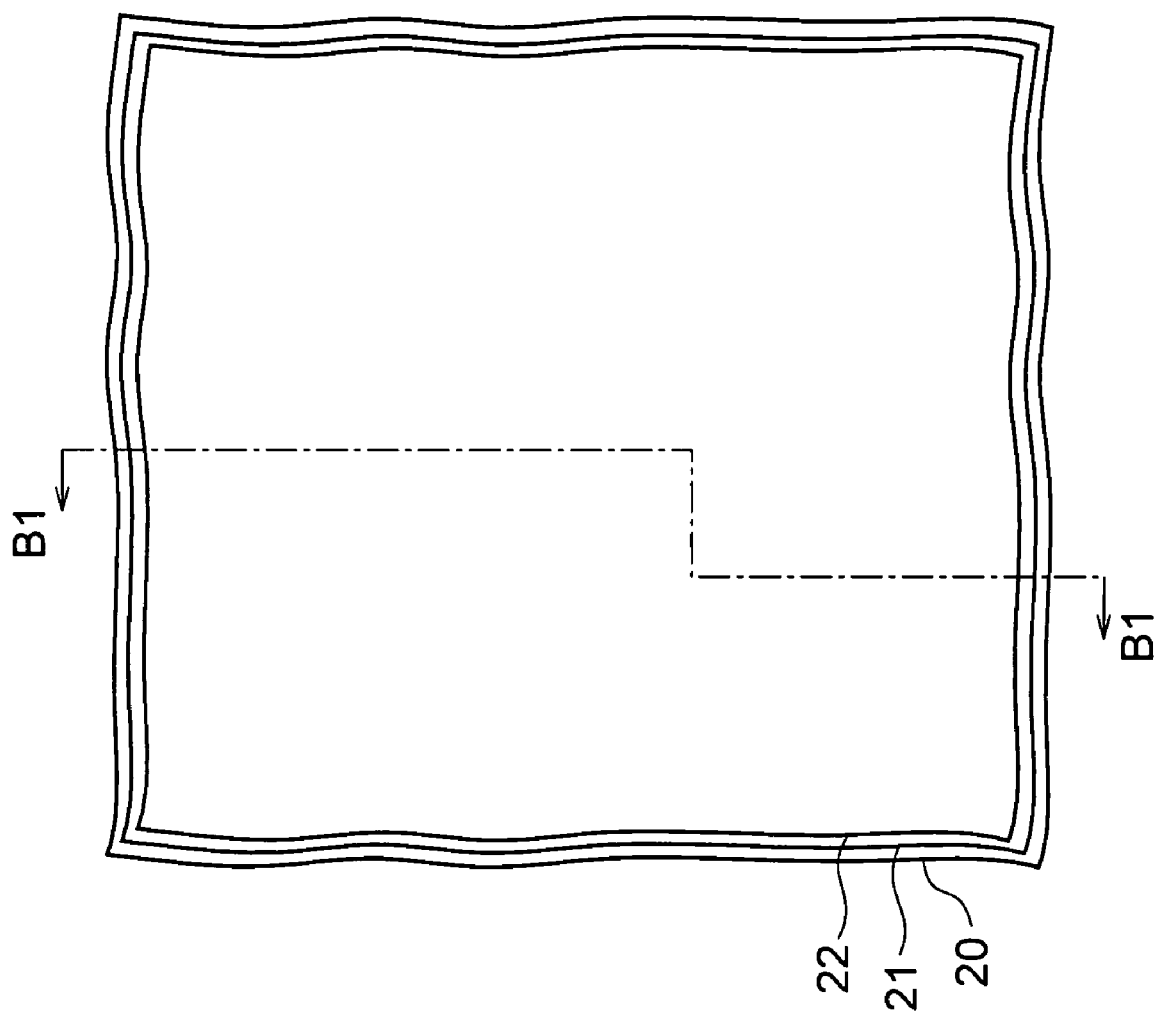

FIG. 18A is a plan view in a state after the completion of the above step. FIG. 17A corresponds to a cross-sectional view taken along the line B1-B1 of FIG. 18A.

Subsequently, as shown in FIG. 17B, a first contact hole 22a extending to the superconducting ground plane 21 is formed by patterning the underlying insulating layer 22 by Ar ion milling using a resist pattern (not shown).

Figure 18B:
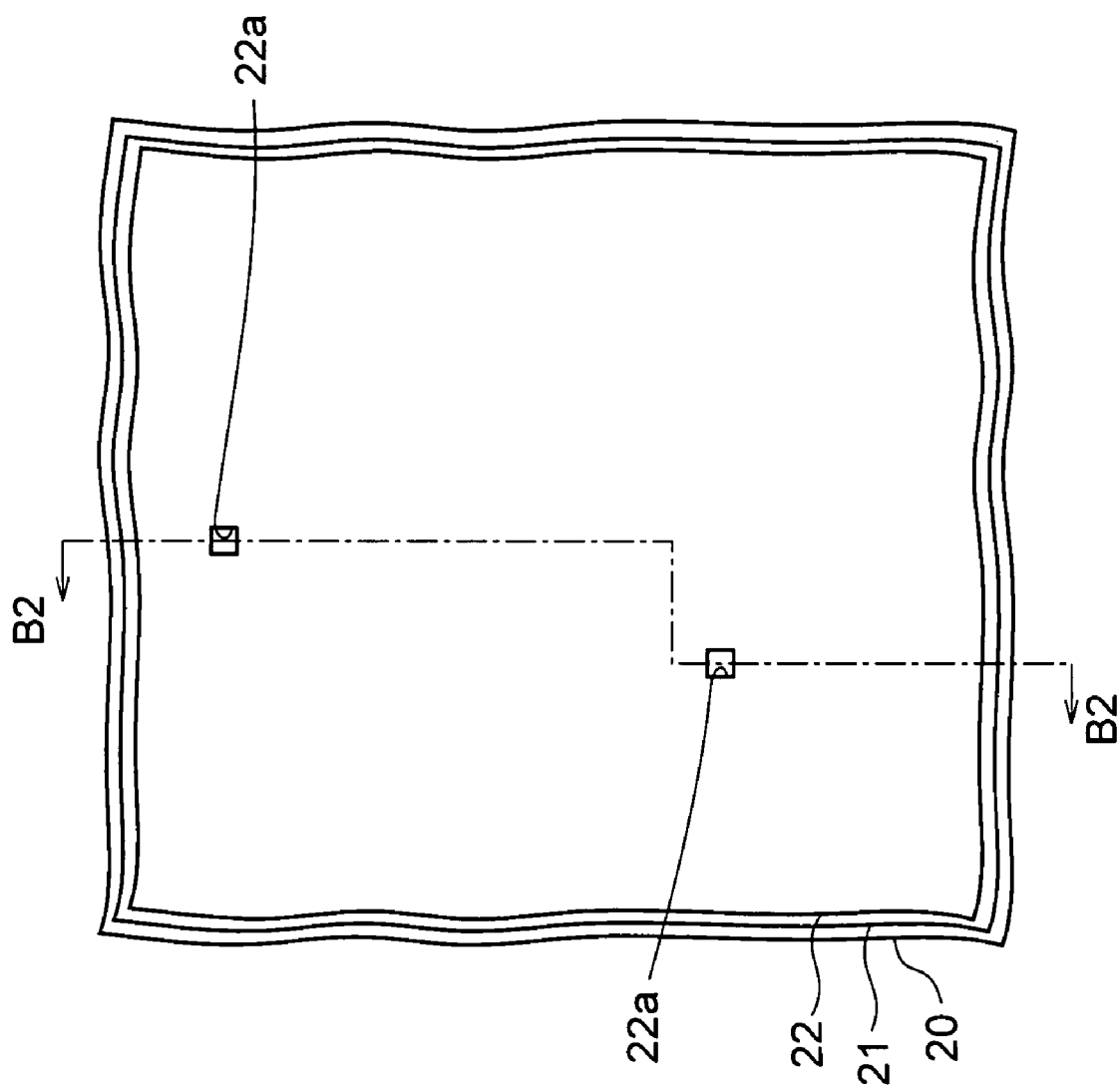

FIG. 18B is a plan view in a state after the completion of the above step. FIG. 17B corresponds to a cross-sectional view taken along the line B2-B2 of FIG. 18B.

Then, as shown in FIG. 17C, a lanthanum-doped YBCO layer is formed as a first superconducting layer 23 on the underlying insulating layer 22 and within the contact hole 22a. The first superconducting layer 23 is formed, for example, at a substrate temperature of 740° C. in an atmosphere of oxygen by the pulse laser deposition method. Here, the thickness of the first superconducting layer 23 is about 200 nm. The first superconducting layer 23 only needs to be an oxide superconducting layer, and is not limited to the lanthanum-doped YBCO layer.

Moreover, a method of forming the first superconducting layer 23 is not limited to the pulse laser deposition method, and may be the sputtering method. However, when employing any deposition method, the substrate needs to be heated to form the first superconducting layer 23.

Thereafter, an SSO layer with the thickness of about 300 nm is formed on the first superconducting layer 23 by the pulse laser deposition method, and is used as a first insulating layer 24. Although the deposition condition of the first insulating layer 24 is not particularly limited, substrate temperature is set to about 700° C. in an atmosphere of oxygen in the present embodiment.

FIG. 18C is a plan view in a state after the completion of the above step. FIG. 17C corresponds to a cross-sectional view taken along the line B3-B3 of FIG. 18C.

Figure 17D:
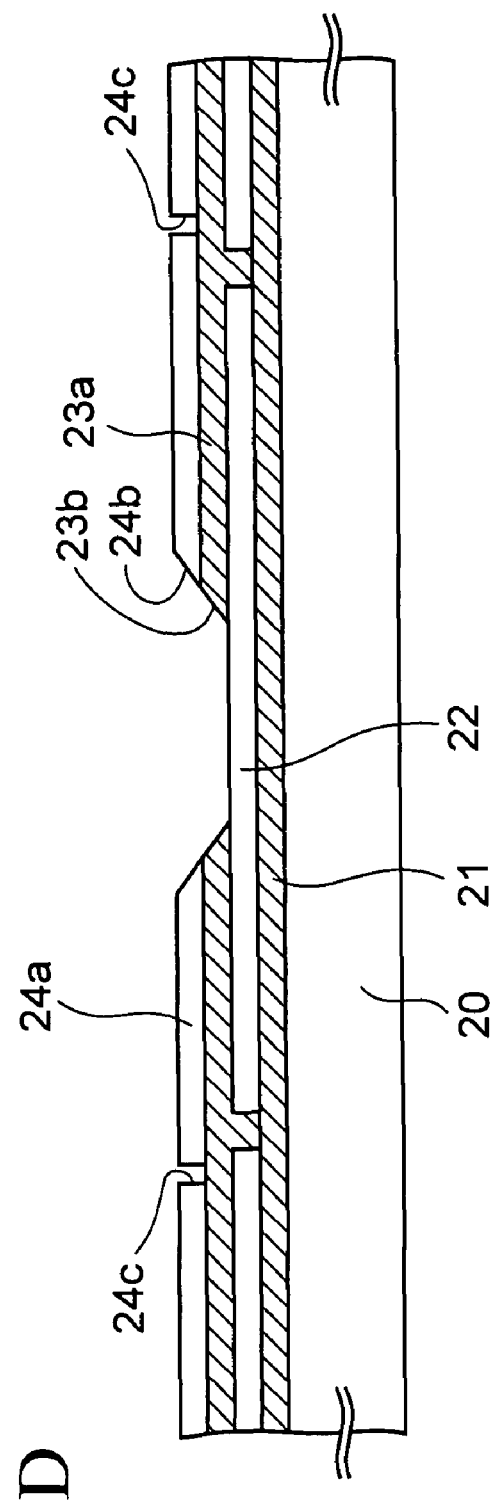

Subsequently, as shown in FIG. 17D, a part of the first insulating layer 24 is etched and removed by Ar ion milling using a resist pattern (not shown). Thereby, the first insulating layer 24 is made into a first insulating pattern 24a provided with a first opening 24b and a second contact hole 24c.

Subsequently, the first superconducting layer 23 under the first opening 24b is removed by Ar ion milling using the first insulating pattern 24a as a mask. As a result of this ion milling, the first superconducting layer 23 is made into a first superconducting pattern 23a provided with an edge surface 23b which is continuous with an edge surface of the first opening 24b. This first superconducting pattern 23a is also referred to as a "base electrode." Thereafter, the resist pattern is removed.

Figure 18D:
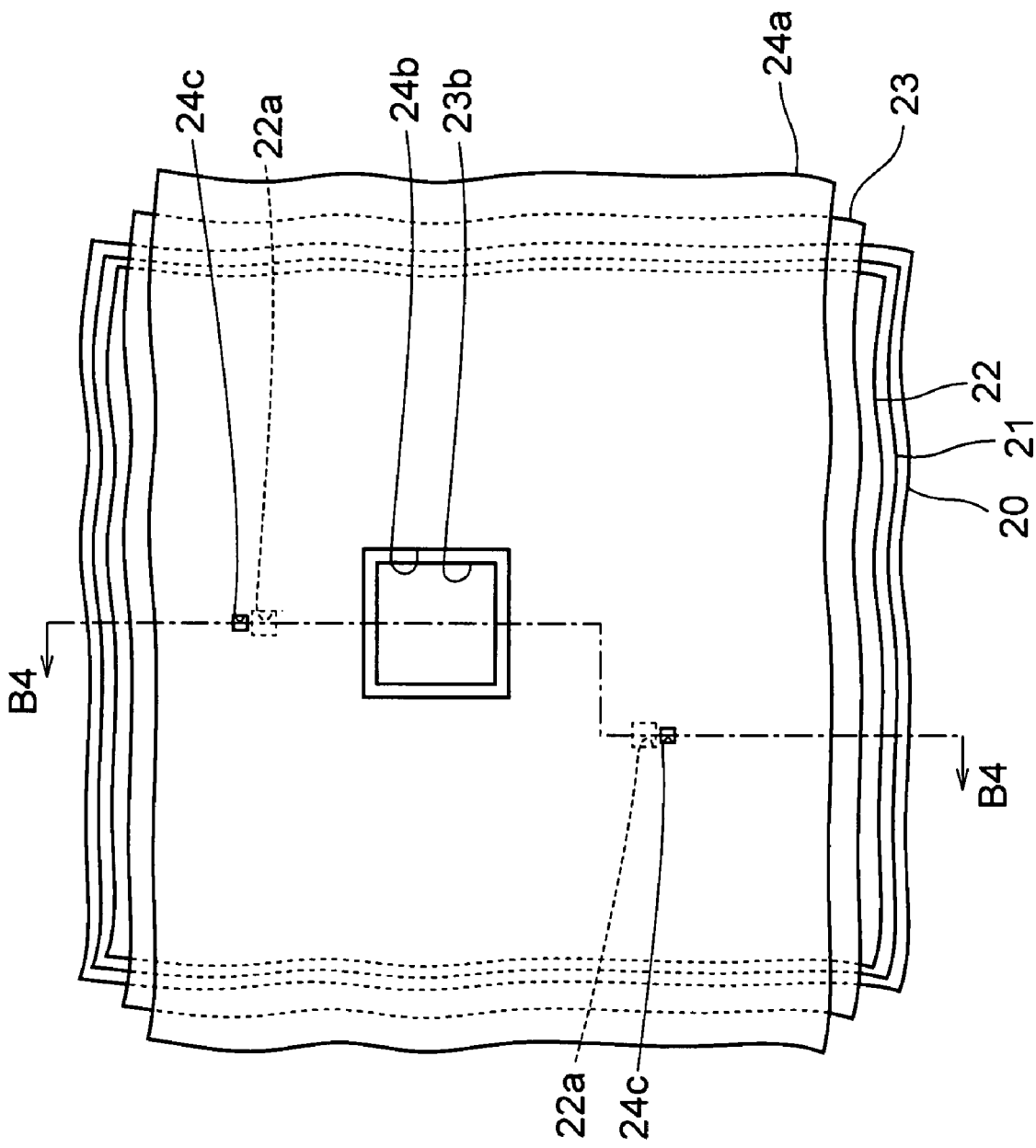

FIG. 18D is a plan view in a state after the completion of the above step. FIG. 17D corresponds to a cross-sectional view taken along the line B4-B4 of FIG. 18D.

Descriptions will now be given of the steps up to the step of obtaining a cross-sectional structure as shown in FIG. 17E.

First, a lanthanum-doped YBCO layer is formed on an entire upper surface of the insulating substrate 20 by the pulse laser deposition method, and thereby the second contact hole 24c is completely filled with the YBCO layer. Then, the YBCO layer is etched back by Ar ion milling method, and thereby an unnecessary portion of the YBCO layer on the first insulating pattern 24a is removed. As a result, the YBCO layer is left only in the second contact hole 24c as a conductive plug 26.

Furthermore, a $CeO_2$ layer with the thickness of about 400 nm is formed on an entire upper surface of the insulating substrate 20 by the pulse laser deposition method, and the $CeO_2$ layer is used as a second insulating layer 27. The second insulating layer 27 is formed at a substrate temperature of about 640° C. in an atmosphere of oxygen.

Then, as shown in FIG. 17F, a resist pattern (not shown) is formed on the second insulating layer 27, and then the second insulating layer 27 is etched by the Ar ion milling method using the resist pattern as a mask. Thereby, the second insulating layer 27 is made into a second insulating pattern 27a provided with a third contact hole 27c and a second opening 27b overlapping the first opening 24b. After that, the resist pattern used as the mask is removed.

Figure 18E:
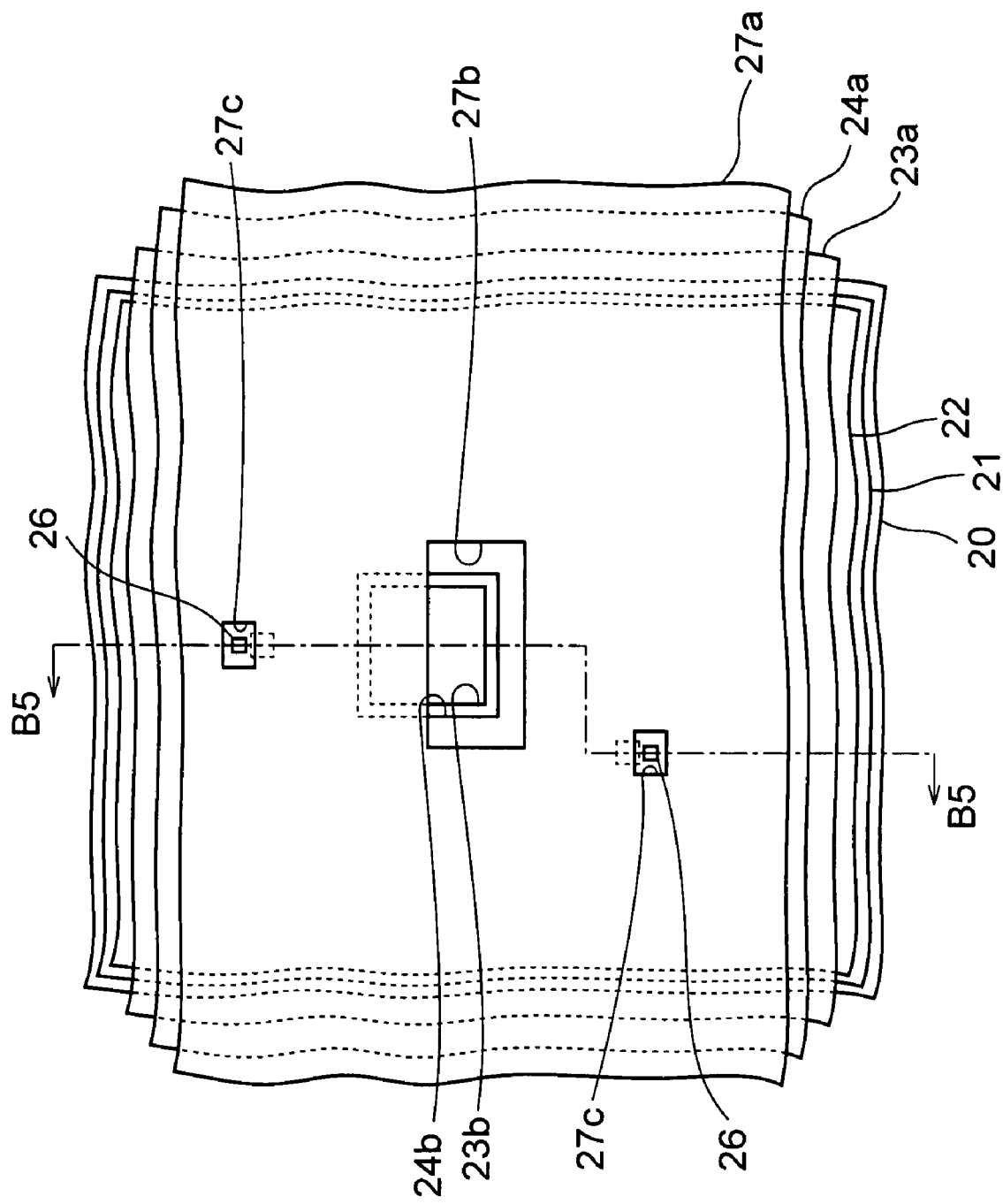

FIG. 18E is a plan view in a state after the completion of the above step. FIG. 17F corresponds to a cross-sectional view taken along the line B5-B5 of FIG. 18E.

Figure 17G:
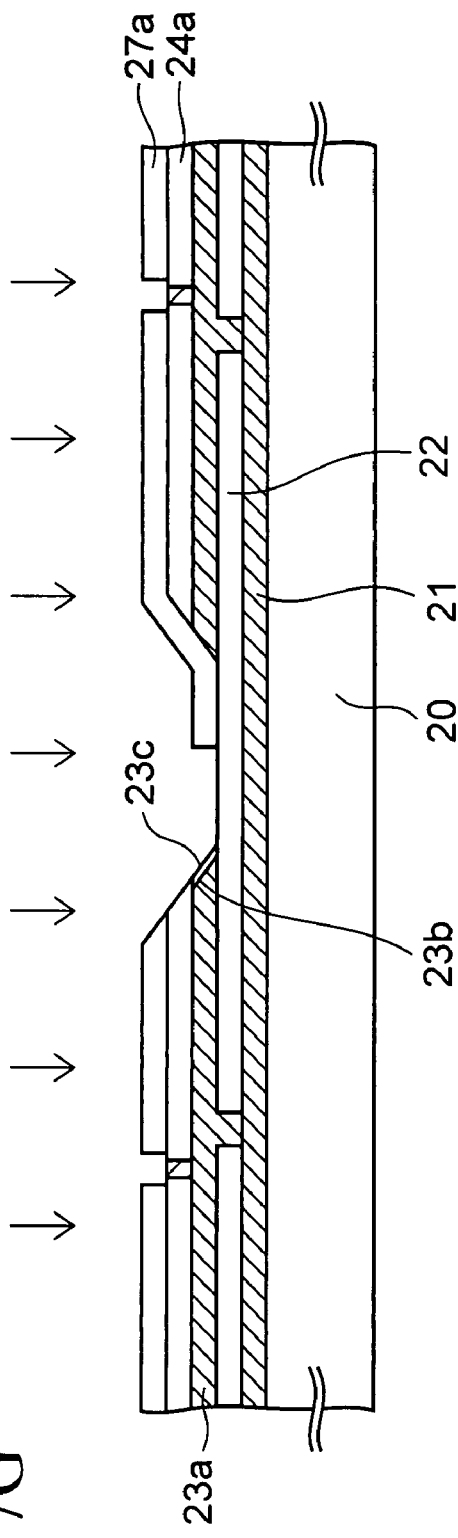

Subsequently, as shown in FIG. 17G, the insulating substrate 20 is perpendicularly irradiated with argon ions, and thereby the inclined surface 23b of the first superconducting pattern 23a is modified, so that an amorphous layer 23c is formed. In the present embodiment, the conditions for argon ion irradiation are: an accelerating voltage of about 500 V for the ions; and an ion current of about 60 mA, although these conditions are not particularly limited.

Figure 17H:
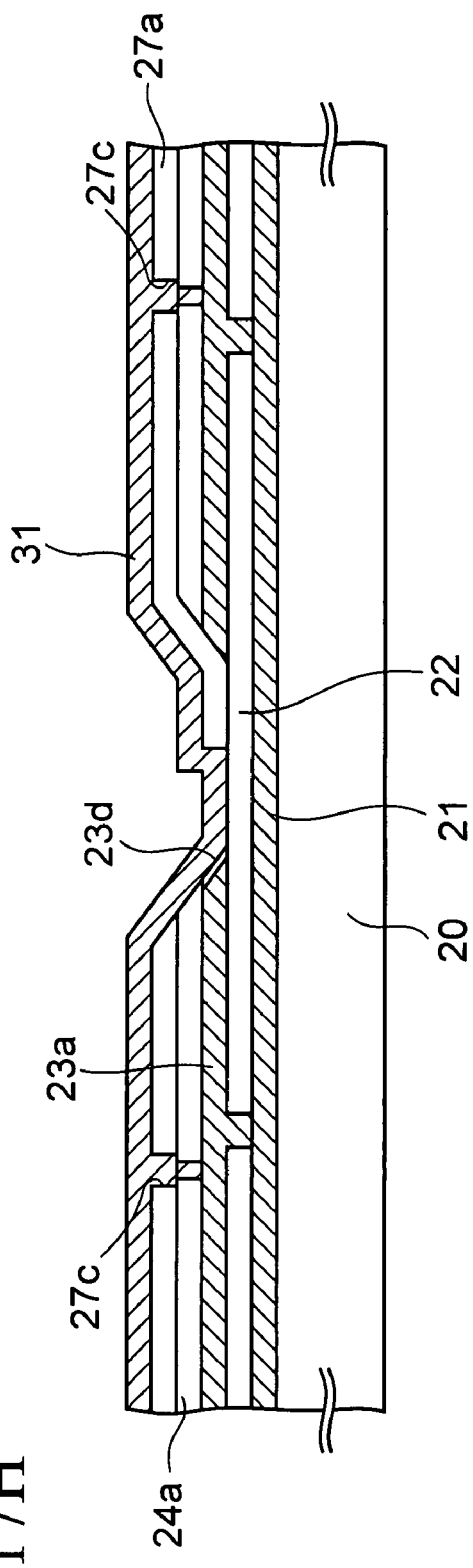

Next, as shown in FIG. 17H, a $Yb_1Ba_2Cu_3O_{7-x}$ (YbBCO) layer with the thickness of about 200 nm is formed as a second superconducting layer 31 on the second insulating pattern 27a by using the pulse laser deposition method under the conditions of a substrate temperature of 700° C. in an atmosphere of oxygen. Note that the second superconducting layer 31 only needs to be an oxide superconducting layer, and is not limited to the YbBCO layer.

Furthermore, instead of the pulse laser deposition method, sputtering method may be employed to form the second superconducting layer 31. When employing any deposition method, however, the substrate needs to be heated for forming the second superconducting layer 31.

The amorphous layer 23c formed on the tapered surface of the first superconducting pattern 23a is recrystallized by heat due to the heating of the substrate, and is thereby made into a surface-modified type barrier layer 23d for a ramp-edge type junction.

The barrier layer 23d is unstable against heat. Therefore, when the substrate is heated after forming the barrier layer 23d, constituent elements of the underlying insulating layer 22 or of the first insulating pattern 24a may possibly be diffused into the barrier layer 23d under the influence of thermal energy due to the heating of the substrate. This may possibly change the characteristics of the barrier layer 23d.

To deal with this problem, in the present embodiment, the step of forming the second superconducting layer 31 is the last step requiring the heating of the substrate. After this step, the substrate is not heated.

Figure 17I:
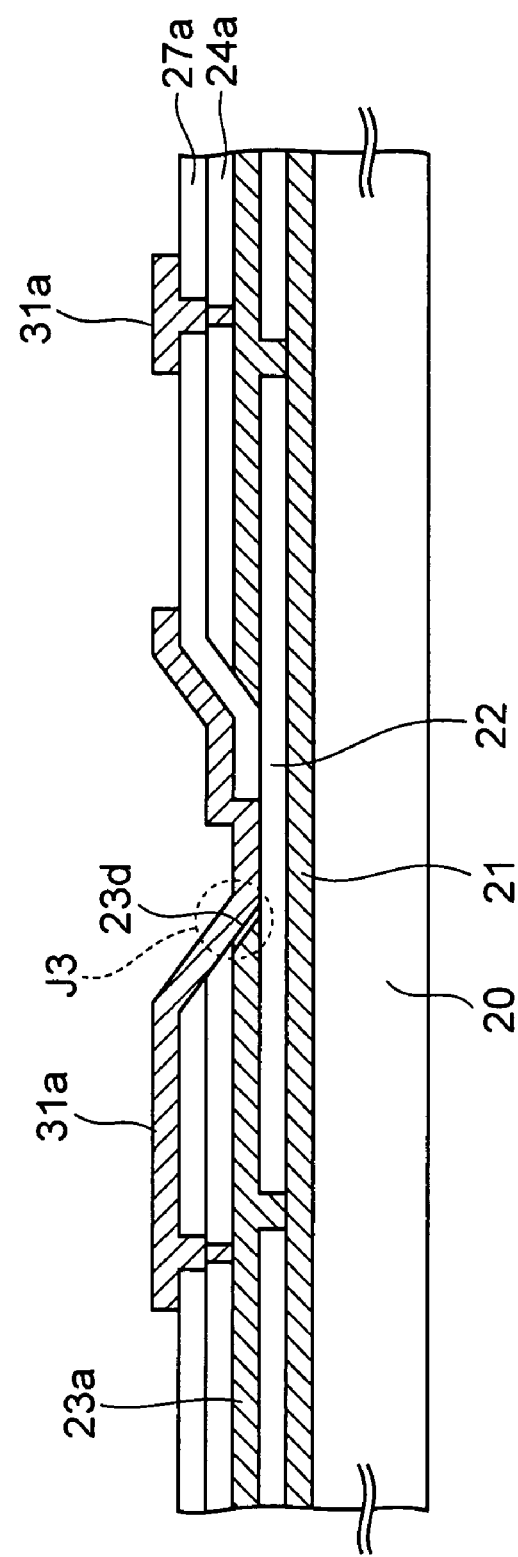

Thereafter, as shown in FIG. 17I, an uppermost-level second superconducting pattern 31a is formed by etching the second superconducting layer 31 by Ar ion milling using a resist pattern (not shown) as a mask. Note that the second superconducting pattern 31a may also be referred to as a "counter electrode."

The aforementioned barrier layer 23d is formed on the lower surface of the second superconducting pattern 31a. The barrier layer 23d and the first and second superconducting patterns 23a and 31a constitute a Josephson junction J3.

Figure 18F:
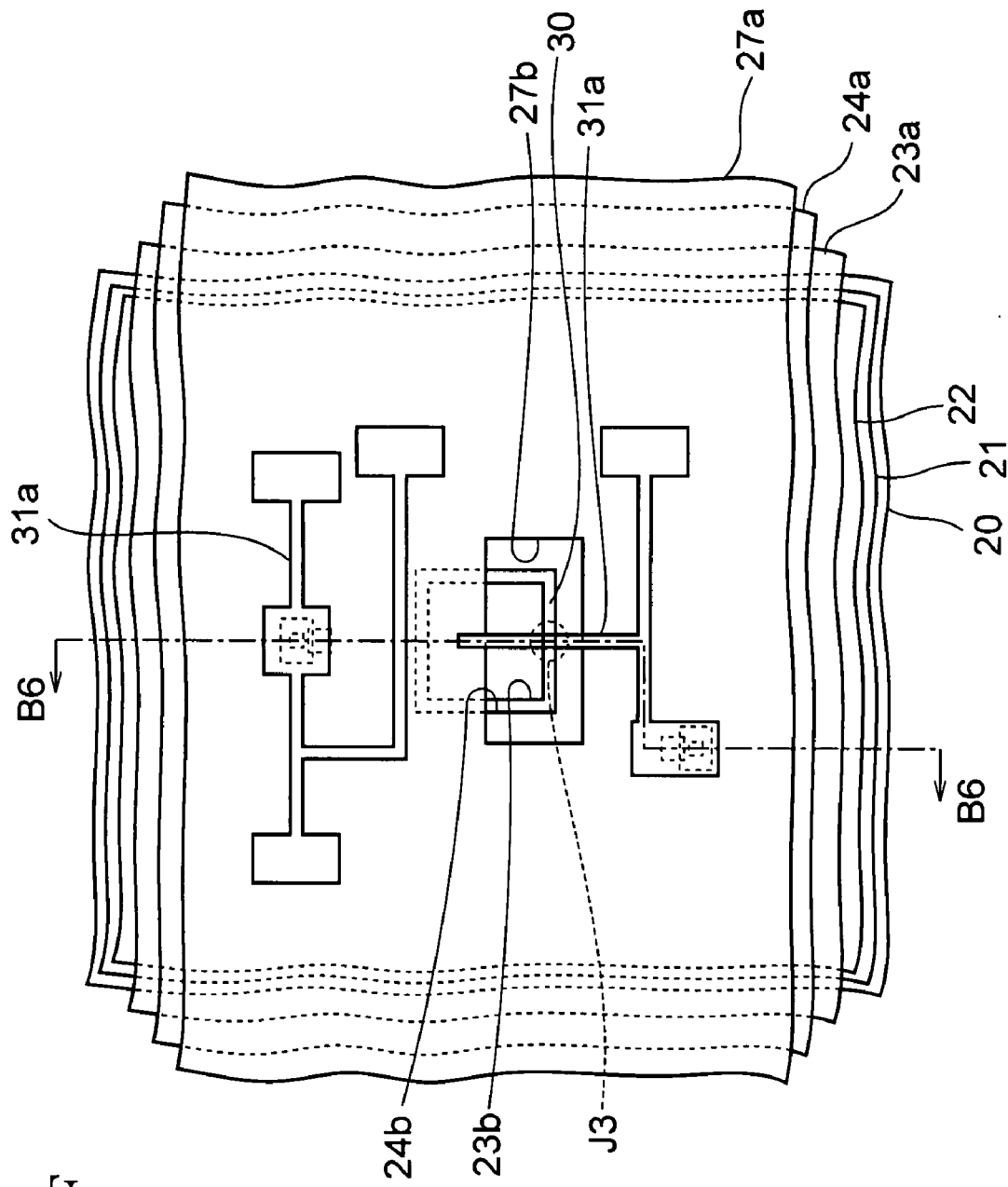

FIG. 18F is a plan view in a state after the completion of the above step. FIG. 17I corresponds to a cross-sectional view taken along the line B6-B6 of FIG. 18F.

As shown in FIG. 18F, the second superconducting pattern 31a above the first insulating pattern 24a constitutes a circuit layer provided with wiring that is a circuit element of a superconducting circuit.

As previously mentioned, since the barrier layer 23d (see FIG. 17I) is unstable against heat, the step requiring the heating of the substrate, such as the step of forming an insulating layer or a superconducting layer made of an oxide, is not performed after forming the second superconducting pattern 31a. Thereby, change in the characteristics of the barrier 23d due to heat is avoided.

As shown in FIG. 17I, this superconducting device has a multilayer structure formed of the first and second superconducting patterns 23a and 31a. The second superconducting pattern 31a constitutes the circuit layer including the circuit element, such as wiring, above the first insulating pattern 24a. Thus, this superconducting device is advantageous in achieving a large-scale superconducting circuit, as compared to the conventional superconducting device in which only one layer of a superconducting pattern is formed.

Furthermore, in the present embodiment, the step of forming the second superconducting layer 31 is set to be the last step requiring the heating of the substrate, in order to minimize deterioration in the surface-modified type barrier layer 23d which is susceptible to heat, as compared to other barrier layers such as an artificial thin film. This suppresses deterioration in the characteristics of the Josephson junction J3 formed of the barrier layer 23d, such as a decrease in the Josephson critical current. Thus, it is made possible to form a superconducting pattern of a multilayer structure which is advantageous in achieving a large-scale circuit.

As described above, according to the present invention, the Josephson junction is formed concurrently with the time when the uppermost-level superconducting thin film layer is superposed. Thus, the present invention makes it possible to provide the superconducting device of the multilayer structure, in which junction characteristics thereof is not deteriorated or changed, and in which the uppermost-level oxide superconducting thin film layer can be used as the circuit layer. Accordingly, the present invention has broad applicability in the device manufacturing industry.

What is claimed is:

1. A superconducting device of a multilayer structure in which a first to an (n−1)th oxide superconducting layers (n is an integer more than one) and a first to an (n−1)th oxide insulating layers are alternately superposed on each other on an insulating substrate, and in which an n-th oxide superconducting layer is superposed on the (n−1)th oxide insulating layer as an uppermost-level oxide insulating layer, and which includes a Josephson junction, wherein
    (i) the Josephson junction is formed by forming at least one of junction electrodes concurrently with the time when the n-th oxide superconducting layer as an uppermost-level oxide superconducting layer is superposed,
    (ii) at least the uppermost-level oxide superconducting layer of the multilayer structure includes a circuit element pattern,
    (iii) the uppermost-level oxide superconducting layer, and the first to the (n−1)th oxide superconducting layers as other oxide superconducting layers of the multilayer structure are made of an identical material, and
    (iv) edges of the other oxide superconducting layers and the first to the (n−1)th oxide insulating layers are a tapered surface reaching the insulating substrate, and the uppermost-level oxide superconducting layer is in direct contact with the tapered surface the other oxide superconducting layers and the first to the (n−1)th oxide insulating layers, and with an upper surface of the insulating substrate.

2. The superconducting device according to claim 1, wherein
    the insulating substrate is a bicrystal substrate, and
    the Josephson junction is a bicrystal-type Josephson junction formed on the substrate.

3. The superconducting device according to claim 1 or claim 2, wherein the circuit element is any one of a wiring and a coil.

4. The superconducting device according to claim 1, wherein
the insulating substrate is a substrate having a step on a surface thereof, and
the Josephson junction is a step-edge type Josephson junction formed on the step of the substrate.

5. A superconducting device of a multilayer structure in which a first oxide superconducting layer, an oxide insulating layer and a second oxide superconducting layer are superposed in this order on an insulating substrate, and which includes a Josephson junction, wherein
(i) the Josephson junction is formed by forming at least one of junction electrodes concurrently with the time when the second oxide superconducting layer as an uppermost-level oxide superconducting layer is superposed,
(ii) at least the uppermost-level oxide superconducting layer of the multilayer structure includes a circuit element pattern,
(iii) the uppermost-level oxide superconducting layer, and the first oxide superconducting layer as another oxide superconducting layer of the multilayer structure, are made of an identical material, and
(iv) edges of the another oxide superconducting layer and the oxide insulating layer are a tapered surface reaching the insulating substrate, and the uppermost-level oxide superconducting layer is in direct contact with the tapered surface of the another oxide superconducting layer and the oxide insulating layer, and with an upper surface of the insulating substrate.

6. The superconducting device according to claim 5, wherein
the insulating substrate is a bicrystal substrate, and
the Josephson junction is a bicrystal-type Josephson junction formed on the substrate.

7. The superconducting device according to claim 5, wherein the circuit element is any one of a wiring and a coil.

8. The superconducting device according to claim 5, wherein
the insulating substrate is a substrate having a step on a surface thereof, and
the Josephson junction is a step-edge type Josephson junction formed on the step of the substrate.

* * * * *